(12) United States Patent
Bondokov et al.

(10) Patent No.: US 12,163,250 B1
(45) Date of Patent: Dec. 10, 2024

(54) CONTROL OF BASAL PLANE DISLOCATIONS IN LARGE ALUMINUM NITRIDE CRYSTALS

(71) Applicants: Robert T. Bondokov, Watervliet, NY (US); Sean P. Branagan, Green Island, NY (US); James Grandusky, Green Island, NY (US); Kasey Hogan, Green Island, NY (US); Justin Mark, Green Island, NY (US); Jianfeng Chen, Ballston Lake, NY (US)

(72) Inventors: Robert T. Bondokov, Watervliet, NY (US); Sean P. Branagan, Green Island, NY (US); James Grandusky, Green Island, NY (US); Kasey Hogan, Green Island, NY (US); Justin Mark, Green Island, NY (US); Jianfeng Chen, Ballston Lake, NY (US)

(73) Assignee: Crystal IS, Inc., Green Island, NY (US)

( * ) Notice: Subject to any disclaimer, the term of this patent is extended or adjusted under 35 U.S.C. 154(b) by 3 days.

(21) Appl. No.: 18/113,752

(22) Filed: Feb. 24, 2023

Related U.S. Application Data

(63) Continuation-in-part of application No. 16/991,278, filed on Aug. 12, 2020.

(60) Provisional application No. 63/332,770, filed on Apr. 20, 2022, provisional application No. 62/887,033, filed on Aug. 15, 2019.

(51) Int. Cl.
*C30B 29/40* (2006.01)
*C01B 21/072* (2006.01)
*C30B 23/00* (2006.01)

(52) U.S. Cl.
CPC .......... *C30B 29/403* (2013.01); *C01B 21/072* (2013.01); *C01P 2002/84* (2013.01); *C30B 23/002* (2013.01)

(58) Field of Classification Search
None
See application file for complete search history.

(56) References Cited

U.S. PATENT DOCUMENTS

2014/0077218 A1* 3/2014 Hayashi ............. H01L 29/2003
257/615
2014/0271439 A1* 9/2014 Wada ................. C30B 29/403
117/77

OTHER PUBLICATIONS

Dalmau, et al., "High Quality AlN Single Crystal Substrates for AlGaN-Based Devices", Jun. 5, 2018, Materials Science Forum, vol. 924, pp. 923-926 (Year: 2018).*

* cited by examiner

*Primary Examiner* — Seth Dumbris
(74) *Attorney, Agent, or Firm* — Morgan, Lewis & Bockius LLP

(57) ABSTRACT

In various embodiments, aluminum nitride single crystals are rapidly diameter-expanded during growth and have large crystal augmentation parameters. The aluminum nitride single crystals advantageously have low densities of basal plane dislocations and large substrate versatility metrics.

20 Claims, 15 Drawing Sheets

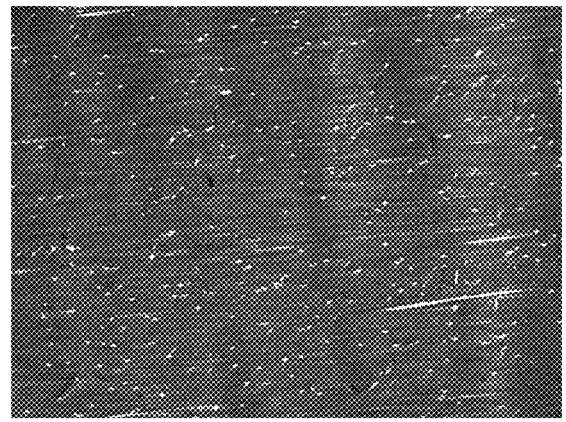
FIG. 6F
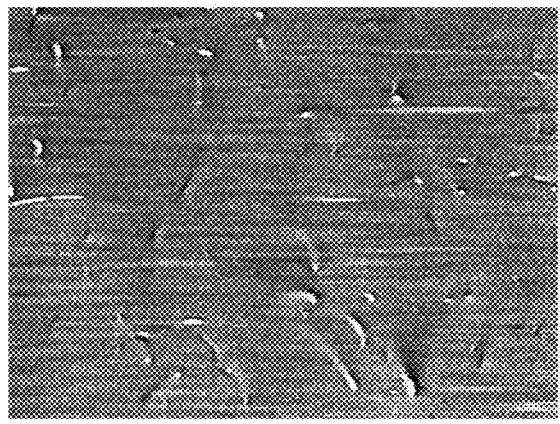 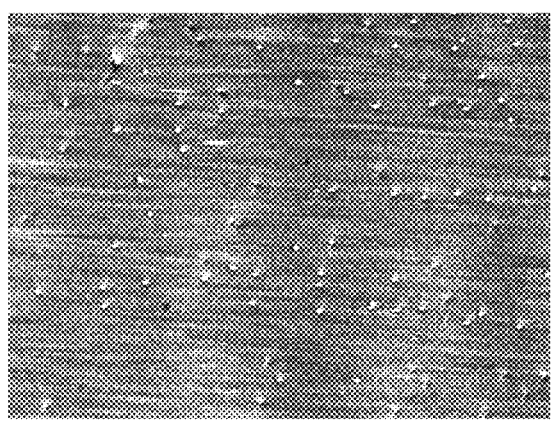
FIG. 6G                    FIG. 6H

CONTROL OF BASAL PLANE DISLOCATIONS IN LARGE ALUMINUM NITRIDE CRYSTALS

RELATED APPLICATIONS

This application claims the benefit of and priority to U.S. Provisional Patent Application No. 63/332,770, filed Apr. 20, 2022, the entire disclosure of which is hereby incorporated herein by reference. This application is also a continuation-in-part of U.S. patent application Ser. No. 16/991,278, filed Aug. 12, 2020, which claims the benefit of and priority to U.S. Provisional Patent Application No. 62/887,033, filed Aug. 15, 2019, the entire disclosure of each of which is hereby incorporated herein by reference.

TECHNICAL FIELD

In various embodiments, the present invention relates to the fabrication of single-crystal aluminum nitride (AlN).

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of low-defect single crystals of AlN.

To make single-crystal AlN substrates more readily available and cost-effective, and to make the devices built thereon commercially feasible, it is desirable to grow AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. Nos. 6,770,135 (the '135 patent), 7,638,346 (the '346 patent), 7,776,153 (the '153 patent), and 9,028,612 (the '612 patent), the entire disclosures of which are incorporated by reference herein, describe various aspects of sublimation-recondensation growth of AlN, both seeded and unseeded.

While AlN substrates are enabling platforms for the fabrication of UV light-emitting devices such as LEDs and electronic device such as high-speed transistors, high-quality bulk crystalline AlN material is often unavailable in volumes necessary for widespread commercial adoption of these technologies. Sublimation-recondensation crystal growth of AlN often utilizes small-diameter, high-quality seed crystals as platforms for the growth of longer AlN crystalline boules. However, cost-effective production of AlN devices will require larger diameter AlN substrates over time. In order to address this need, crystal growth of AlN frequently involves "diameter expansion," i.e., modification of the thermal field in the growth chamber to increase the rate of crystal growth in the lateral direction (i.e., perpendicular to the "growth direction" along which the crystalline boule increases in length away from the seed crystal). Conventional diameter-expansion techniques may successfully enlarge the diameter of the growing crystal, but the expansion rate is limited due to deleterious impacts on the quality of the growing crystal. Specifically, excessive modification of the thermal field in conventional techniques can result in highly defective or even polycrystalline material, particularly at the edges of the growing crystal. Other defects such as low-angle grain boundaries and dislocations, non-uniformities in doping, and even crystal fracture can also result. Thus, many conventional diameter-expansion efforts can be wasteful and self-defeating, as highly defective edge material is often unsuitable for device applications and must be removed from the crystalline boule.

In view of the foregoing, there is a need for crystal-growth techniques capable of high rates of diameter expansion while maintaining high crystalline quality of the resulting AlN single crystals, as well as the large AlN single crystals enabled by such techniques.

SUMMARY

In various embodiments of the present invention, large, high-quality single crystals of AlN are produced via techniques enabling high rates of diameter expansion without compromising crystalline quality. Exemplary growth techniques utilize baseline radial thermal gradients established at least in part via, for example, the placement and configuration of thermal shielding external to the growth chamber. These radial thermal gradients, and/or the lateral growth rates of the AlN crystal, are subsequently enhanced via additional techniques, thereby enabling more rapid diameter expansion and the growth of large, high-quality AlN single crystals. Despite the more rapid expansion of crystal diameter, AlN single crystals formed in accordance with embodiments of the present invention maintain high levels of crystal quality, even at the edges of the crystal and even for high rates of diameter expansion. Thus, embodiments of the present invention provide techniques, and AlN single crystals themselves, which are more economical and more suited for mass production of substrates and devices.

In accordance with embodiments of the invention, techniques for enhancing the radial thermal gradient in the crystal-growth chamber include the use of thermal shields disposed internal to the chamber and proximate the growing crystal. In accordance with various embodiments, such internal thermal shields influence the thermal field proximate the growing crystal, and the lateral growth rate thereof, more effectively than external shields located outside of the growth crucible itself. For example, in various embodiments the internal thermal shields define openings therethrough, and these openings accommodate the growth of the crystal through the shields while they influence the thermal field to enable rapid diameter expansion. Additional techniques in accordance with embodiments of the invention for promoting increased rates of lateral crystal growth (and thus concomitant diameter expansion) also include enhancement of atomic nitrogen in the vapor phase, preferentially concentrated at the lateral edge of the crystal (e.g., via use of a plasma proximate the lateral edge of the crystal). Such techniques promote enhanced lateral growth (i.e., high-rate diameter expansion) of the AlN crystal while preserving high crystalline quality.

Embodiments of the invention enable and facilitate the growth of AlN single crystals having large crystal augmentation parameters (as defined hereinbelow), masses, and/or volumes heretofore unavailable via conventional crystal-growth techniques. AlN single crystals in accordance with embodiments of the invention may therefore be utilized as cost-effective, high-quality platforms for the fabrication of electronic and optical devices. Techniques in accordance with embodiments of the invention are particularly suited for seeded growth of AlN single crystals from seed crystals, rather than for unseeded growth relying upon, for example, spontaneous nucleation of crystalline material and/or growth guided by tapered growth crucibles themselves. Such unseeded growth techniques are typically unable to produce AlN single crystals having large crystal augmentation parameters and uniformly high levels of crystalline quality. Thus, in accordance with embodiments of the present invention, AlN single crystals (or boules), being formed via seeded growth, typically have one planar surface having the size and shape substantially corresponding to the seed crystal (or exposed area of the seed crystal) utilized for growth of the crystal; such crystal shapes are different from those of unseeded crystals, which typically taper down to much smaller, point-like areas, since they generally initially nucleate at a small, limited-volume point (e.g., the sharp tip of a conical portion of a crystal-growth crucible).

In various embodiments, all or a portion of the seed crystal (e.g., at least the exposed area thereof) is incorporated into (i.e., a portion of) the boule when it is removed from the growth system after growth. That is, a boule grown by seeded growth may incorporate at least a portion of the seed itself, and the interface between the seed crystal and the boule is further evidence of seeded growth. (In various embodiments, portions of the seed not exposed for growth thereon may sublime away during the growth and therefore not be present after the growth.) The seed-boule interface is typically detectable by one or more characterization techniques, including optical inspection (a visible line may be detectable at the interface and result from differential incorporation of point defects and/or impurities in the seed and in the boule), luminescence contrast (e.g., under 254 nm light, the seed may appear darker or brighter than the boule due to, for example, differential incorporation of point defects and/or impurities), or measurement of UV absorption, which may vary between the initial seed and the grown boule.

In accordance with embodiments of the present invention, single-crystal AlN may be fabricated via sublimation-recondensation from polycrystalline AlN source material. As described in the '135 patent, the '346 patent, the '153 patent, and the '612 patent, the sublimation-recondensation growth process is desirably performed under a steep axial (i.e., in the direction of crystal growth away from a seed, if a seed is present, and/or toward sublimating source material) temperature gradient, while radial temperature gradients may be utilized to control the diameter of the growing crystal and influence its crystalline quality. In various embodiments of the present invention, the baseline radial and/or axial thermal gradients within the crystal-growth crucible utilized to promote and control the growth of the AlN material may be controlled in various different manners. For example, individual heating elements arranged around the crucible may be powered to different levels (and thus different temperatures) to establish thermal gradients within the crucible. In addition or instead, thermal insulation may be selectively arranged around the crucible such that thinner and/or less insulating insulation is positioned around areas of higher desired temperature. As detailed in the '612 patent, thermal shields may also be arranged around the crucible, e.g., above and/or below the crucible, in any of a multitude of different arrangements in order to establish desired baseline thermal gradients within the crucible. Once and/or while these baseline thermal gradients are established, at least the radial thermal gradient (i.e., the thermal gradient perpendicular to the lateral growth direction away from the seed crystal and parallel to the diameter of the growing crystal (which may be expanding during all or a portion of the growth process)) is enhanced via use of one or more techniques that enhance lateral growth of the crystal while maintaining crystal quality.

Embodiments of the present invention also enable rapid diameter expansion of AlN single-crystal boules on seed crystals of arbitrary crystalline orientation and polarity, as well as within single growth stages. For example, embodiments of the invention obviate the need to utilize (but may utilize) Al-polarity, c-face seed crystals for rapid diameter expansion and preserve high crystal quality without the need for multiple different growth stages, each initiated on a larger seed crystal, for example as disclosed in U.S. patent application Ser. No. 16/008,407, filed on Jun. 14, 2018 (the '407 application), the entire disclosure of which is incorporated by reference herein. Thus, embodiments of the invention may utilize seed crystals having c-face and N-polarity, c-face and Al-polarity, m-face, etc. In addition, seed crystals in accordance with embodiments of the invention need not have any particular diameter or minimum diameter to enable high-quality crystal growth with rapid diameter expansion. For avoidance of doubt, the techniques detailed herein in accordance with embodiments of the invention enable higher rates of diameter expansion of growing AlN single crystals, while preserving crystal quality (and therefore, the production of AlN single crystals having larger crystal augmentation parameters, as detailed herein), than do techniques detailed in the '407 application.

The techniques detailed herein may also be utilized to fabricate large AlN single crystals (e.g., boules and wafers therefrom) featuring not only rapid diameter expansion but also control, reduction, or elimination of basal plane dislocations in the crystals. Accordingly, these techniques may include or be based upon those detailed in U.S. patent application Ser. No. 16/991,278, filed on Aug. 12, 2020, and U.S. patent application Ser. No. 16/991,279, filed on Aug. 12, 2020, the entire disclosures of which are incorporated by reference herein.

As known to those of skill in the art, basal plane dislocations are deformation-induced, extended crystallographic defects, which often occur in hcp crystals in which the basal plane is the primary slip plane. The basal plane dislocation core lies in the basal plane with Burgers vectors often having one of the $(112\bar{0})$ directions, thus indicating the slip direction. As also known to those of skill in the art, basal plane dislocations differ from threading and misfit dislocations by (a) their position and symmetry within the crystal and (b) their origin. For example, in PVT bulk single crystals, threading dislocations typically have cores parallel, or at a small angle with respect to, the growth direction. They may be edge, screw, or mixed dislocations. More importantly, threading dislocations typically originate during the nucleation stage of the bulk crystal growth and are a direct result of nucleation conditions. They are normally generated at the beginning of the growth and typically do not appreciably change in density during the growth or during the cool-down from the growth temperature. The table below summarizes the crystallographic differences readily evident between basal plane dislocations and threading dislocations (both screw and edge types) in hcp crystals such as the AlN produced in accordance with embodiments of the present invention. These parameters may be straightforwardly determined by one of skill in the art, without undue experimentation, utilizing characterization techniques such as X-ray topography (e.g., a g×b analysis) or transmission electron microscopy.

| Dislocation type | Crystallographic parameter | | |
|---|---|---|---|
| | Gliding planes | Burgers vector | Dislocation core vector |
| Basal plane dislocation (BPD) | {0001} | (11$\bar{2}$0) | (11$\bar{2}$0) or (1$\bar{1}$00) |
| Threading screw dislocation (TSD) | | (0001) | (0001) |
| Threading edge dislocation (TED) | {1$\bar{1}$00} | (11$\bar{2}$0) | (0001) |

Misfit dislocations are normally associated with epitaxial growth of thin films on bulk crystals and are rarely observed in bulk crystal growth. Specifically, for bulk crystal growth, misfit dislocations can be generated if a non-native seed (i.e., seed of a different material) is employed. In this case, the nucleation stage of the bulk growth represents a heteroepitaxial growth in which misfit dislocations are generated due to differences in substrate and newly grown material lattice parameters. For example, AlN bulk crystals grown on SiC seeds may have misfit dislocation densities exceeding $10^6$ cm$^{-2}$, while those grown on "native" AlN seeds, like those produced in accordance with embodiments of the present invention are typically free or substantially free (e.g., no more than 10 cm$^{-2}$, or no more than 1 cm$^{-2}$) of misfit dislocations.

In some materials including SiC and AlN, during the cool down from the growth temperature, after the growth is completed, basal plane dislocations can bend and transform into threading dislocations, specifically threading screw dislocations. Threading screw dislocations can be electrically active. For instance, threading dislocations may cause large leakage current and lower the forward voltage of a UVC LED. Therefore, AlN crystals with low basal plane dislocation densities are desirable not only for power electronics but also for opto-electronic devices.

In conventional crystal-growth approaches, basal plane dislocations typically arise due to high radial thermal gradients, which are required for diameter expansion and formation of large crystals. Moreover, basal plane dislocation densities also tend to increase as a function of increasing crystal diameter. Thus, diameter expansion during crystal growth, particularly to large diameters, would be expected to result in rampant formation of basal plane dislocations. However, techniques in accordance with embodiments of the present invention may be surprisingly utilized to fabricate large, diameter-expanded AlN single crystals with few if any basal plane dislocations. Accordingly, embodiments of the invention include large-diameter AlN single-crystal boules and substrates having low densities of, or essentially zero, basal plane dislocations. Such AlN crystals have not been fabricated via conventional techniques to date. Indeed, basal plane dislocations are typically not measured or reported for AlN single crystals; as those of skill in the art will recognize, prior reporting of "dislocation density" or "defect density" in AlN single crystals typically does not include basal plane dislocations. That is, as a non-limiting example, existing reports of low dislocation (or "defect") densities, or dislocation (or "defect") density ranges encompassing low or zero levels, in AlN single crystals do not include or apply to basal plane dislocations. Rather, such reports typically only include threading dislocations, i.e., a different class of crystalline defect.

Embodiments of the invention include AlN single-crystal substrates having diameters of 25 mm or more, or even 50 mm or more, and which have large areas (e.g., areas from approximately 0.2 cm$^2$ to approximately 1.8 cm$^2$) that are free of basal plane dislocations. Such areas may be located at approximately the center of the substrate. In various embodiments, the entire surface area of such substrates may be free or substantially free (e.g., no more than 10 cm$^{-2}$, or no more than 1 cm$^{-2}$) of basal plane dislocations.

The techniques detailed herein for enablement of rapid diameter expansion may be combined with techniques for enabling high UV transparency of the AlN single crystals, particularly at deep-UV wavelengths. In various embodiments of the present invention, production of highly UV-transparent single crystals of AlN is enabled via vapor-phase growth, impurity control, post-growth temperature control within the growth system, and post-growth annealing techniques that are isothermal or quasi-isothermal. The resulting single-crystal AlN advantageously exhibits a low UV absorption coefficient (e.g., below 10 cm$^{-1}$, or even below 8 cm$^{-1}$) for wavelengths between 230 nm and 280 nm, or, in various embodiments, for wavelengths between 210 nm and 280 nm. The single-crystal AlN may also desirably exhibit a substantially "flat" UV absorption spectrum for wavelengths between 210 nm and 280 nm, e.g., a UV absorption coefficient that is substantially constant within that wavelength range (or a portion thereof), e.g., constant within ±3 cm$^{-1}$, ±2 cm$^{-1}$, or even ±1 cm$^{-1}$. Such a spectrum may facilitate the engineering and improved performance of optical devices (e.g., light-emitting devices such as light-emitting diodes and lasers), as the optical performance of the AlN single-crystal substrate for such devices will exhibit substantially constant optical properties over the deep-UV wavelength range.

Moreover, AlN single crystals in accordance with embodiments of the invention exhibit steep slopes (i.e., "drop-offs") in their UV absorption spectra near the band edge of AlN, e.g., for wavelengths between approximately 210 nm and approximately 230 nm. This property advantageously contributes to the low UV absorption at deep-UV wavelengths and contributes to more uniform optical performance of substrates fabricated from the AlN crystals, as well as optical devices fabricated thereon.

Furthermore, annealing techniques in accordance with embodiments of the present invention advantageously do not require the elimination of carbon and oxygen from the single-crystal AlN to unreasonably low, impractical levels. Specifically, embodiments of the invention successfully result in low UV absorption at deep-UV wavelengths even for AlN crystals having oxygen and/or carbon concentrations ranging from approximately $10^{18}$ cm$^{-3}$ to approximately $10^{19}$ cm$^{-3}$. In addition, post-growth annealing techniques in accordance with embodiments of the invention may be coupled with high-rate cooling of the AlN crystal within the growth apparatus to, for example, avoid cracking of the crystal, even when such cooling techniques result in the AlN crystal initially exhibiting high levels of UV absorption at certain wavelengths.

The present inventors have found that the presence of carbon impurities can lead to high levels of UV absorption in AlN crystals. Carbon incorporation leads to UV absorption at wavelengths around 265 nm, which can hinder the performance of UV light-emitting devices. In addition, oxygen impurities (or related point defects) typically result in UV absorption at wavelengths around 310 nm. Thus, while control of oxygen contamination is desirable for UV transparency, it is not sufficient to enable UV transparency at many UV wavelengths, particularly those in the deep-UV portion of the optical spectrum. Embodiments of the present invention include techniques for the improvement of UV absorption in AlN single crystals even when oxygen and/or carbon impurity concentrations have been controlled during the AlN fabrication process.

The high radial and axial thermal gradients utilized during crystal growth, as described above, necessarily result in the crystal being formed in a non-isothermal environment. While the thermal gradients enable the formation of large, high-quality AlN crystals, the arrangements of thermal shields, insulation, and related aspects of the growth system responsible for the formation of the thermal gradients during crystal growth also necessarily result in thermal gradients in the growth system during cool-down of the crystal after crystal growth. While various references recommend cooling the as-grown crystal within the growth apparatus at a fairly slow rate in order to control point-defect formation, such slow cooling may result in cracking of the AlN crystal due to thermal-expansion mismatch, particularly for larger AlN crystals (e.g., crystals exceeding approximately 50 mm in diameter). Thus, embodiments of the present invention include cooling the as-grown AlN crystal to approximately room temperature (e.g., approximately 25° C.) within the growth chamber at a high cooling rate (e.g., exceeding 250° C./hour, 300° C./hour, 400° C./hour, or even 500° C./hour) in contradiction of the conventional wisdom and despite concomitant deleterious effects on the UV transparency of the crystal. The cooling from the growth temperature may also be performed without any additional applied heat from the heating elements of the growth system (e.g., applied to decrease the cooling rate, known as "controlled cooling"). The cooling of the crystal may be performed at a rate limited only by, e.g., the thermal mass of the growth system, and steps may be taken to accelerate the cooling of the crystal. For example, after growth the AlN crystal may be moved away from or out of the "hot zone" of the growth system (i.e., the portion of the growth system directly proximate and heated by the heating elements or furnace), and/or gas (e.g., nitrogen gas and/or an inert gas such as argon) may be flowed (e.g., at a flow rate higher than any flow rate utilized during crystal growth) within the system to increase the cooling rate.

After formation of the AlN single crystal and cooling from the growth temperature, the resulting crystal (or a portion thereof, e.g., a wafer or substrate separated from a crystalline boule) may be placed within a high-temperature annealing furnace and annealed under isothermal, or quasi-isothermal, conditions to ensure substantially even heating of the entire crystal. (As utilized herein, "quasi-isothermal" conditions within a furnace correspond to the temperature within the furnace (or a dedicated heating area or "hot zone" thereof) being constant within ±5° C., ±2° C., ±1° C., or even ±0.5° C., and/or to any temperature gradient in any direction within the furnace (or a dedicated heating area or hot zone thereof) being less than 5° C./cm, less than 2° C./cm, less than 1° C./cm, or even less than 0.5° C./cm; such temperature gradients may be at least 0.05° C. or at least 0.1° C. in various embodiments). That is, the annealing conditions may be quite different from those under which the AlN crystal is initially grown and cooled within the crystal-growth crucible and growth system, which are desirably configured to create axial and/or radial thermal gradients therewithin. For example, the crystal may be annealed within a resistively heated or RF-heated furnace configured for isothermal annealing, rather than within the growth apparatus in which it was initially grown. After annealing, the annealed crystal is slowly and controllably cooled from the annealing temperature, for at least a portion of the temperature range between the annealing temperature and room temperature, in order to maintain the low UV absorption achieved within the annealing cycle. In various embodiments, the crystal is not attached or adhered to any part of the furnace during annealing and/or cooling (e.g., unlike during crystal growth, during which the crystal is attached to the crystal-growth crucible, for example, via a seed crystal).

Although embodiments of the invention have been presented herein utilizing AlN as the exemplary crystalline material fabricated in accordance therewith, embodiments of the invention may also be applied to other crystalline materials such as silicon carbide (SiC) and zinc oxide (ZnO); thus, herein, all references to AlN herein may be replaced, in other embodiments, by SiC or ZnO. As utilized herein, the term "diameter" refers to a lateral dimension (e.g., the largest lateral dimension) of a crystal, growth chamber, or other object, even if the crystal, growth chamber, or other object is not circular and/or is irregular in cross-section.

As utilized herein, a "substrate" or a "wafer" is a free-standing portion of a previously grown crystalline boule having top and bottom opposed, generally parallel surfaces. Substrates typically have thicknesses ranging between 200 μm and 1 mm, e.g., between 500 μm (or 550 μm) and 1 mm, and may be utilized as platforms for the epitaxial growth of semiconductor layers and the fabrication of semiconductor devices (e.g., light-emitting devices such as lasers and light-emitting diodes, transistors, power devices, etc.) thereon. Once layers and/or devices have been formed on a substrate, all or a portion of the substrate may be removed therefrom as part of subsequent processing; thus, when such structures are present, remnant "substrates" may have thicknesses less than those mentioned above. As utilized herein, "room temperature" is 25° C.

In an aspect, embodiments of the invention feature an AlN single crystal having a diameter that increases, along at least a portion of a length of the AlN single crystal, from a minimum diameter to a maximum diameter. The AlN single crystal has a crystal augmentation parameter (CAP), in mm, greater than 20. The CAP is defined by:

$$CAP = \frac{A_E - A_S}{L_E} = \frac{\pi}{4 \times L_E}(d_E^2 - d_S^2).$$

$A_E$, in mm², is the cross-sectional area of the AlN single crystal at the maximum diameter, $d_E$ is the maximum diameter of the AlN single crystal in mm, $A_S$, in mm², is the cross-sectional area of the AlN single crystal at the minimum diameter, $d_S$ is the minimum diameter in mm, and $L_E$ is an expansion length, in mm, of the at least a portion of the AlN single crystal along which the diameter increases from the minimum diameter to the maximum diameter.

Embodiments of the invention may include one or more of the following in any of a variety of combinations. The CAP may be greater than 40, greater than 50, greater than 90, greater than 100, greater than 250, greater than 500, greater than 750, or greater than 1000. The CAP may be less than 3000, less than 2500, less than 2000, or less than 1500.

A ratio of a total length of the AlN single crystal, in mm, to the maximum diameter, in mm, may range from approximately 0.3 to approximately 0.6. A ratio of a total length of the AlN single crystal, in mm, to the maximum diameter, in mm, may range from approximately 0.35 to approximately 0.55. A ratio of the expansion length of the AlN single crystal, in mm, to the maximum diameter, in mm, may range from approximately 0.002 to approximately 0.4. A ratio of the expansion length of the AlN single crystal, in mm, to the maximum diameter, in mm, may range from approximately 0.002 to approximately 0.03. A ratio of the expansion length of the AlN single crystal, in mm, to the maximum diameter, in mm, may range from approximately 0.07 to approximately 0.3. A ratio of the expansion length of the AlN single crystal, in mm, to the maximum diameter, in mm, may range from approximately 0.002 to approximately 0.02. A ratio of the expansion length of the AlN single crystal, in mm, to the maximum diameter, in mm, may range from approximately 0.08 to approximately 0.5. A ratio of the expansion length of the AlN single crystal, in mm, to the maximum diameter, in mm, may range from approximately 0.1 to approximately 0.3.

A first region of the AlN single crystal may be shaped as a frustum. A maximum diameter of the frustum may correspond to the maximum diameter of the AlN single crystal and the minimum diameter of the frustum may correspond to the minimum diameter of the AlN single crystal. A second region of the AlN single crystal may be shaped as a dome or cone or frustum extending from the first region. A maximum diameter of the dome or cone or frustum may correspond to the maximum diameter of the AlN single crystal (and/or to the maximum diameter of the first region).

A first region of the AlN single crystal may be shaped as a frustum. A maximum diameter of the frustum may correspond to the maximum diameter of the AlN single crystal and the minimum diameter of the frustum may correspond to the minimum diameter of the AlN single crystal. A second region of the AlN single crystal may be shaped as a cylinder extending from the first region and having a diameter corresponding to the maximum diameter of the AlN single crystal. A third region of the AlN single crystal may be shaped as a dome or cone or frustum extending from the second region. A maximum diameter of the dome or cone or frustum may correspond to the maximum diameter of the AlN single crystal (and/or to the maximum diameter of the first region and/or to the diameter of the second region).

A density of threading edge dislocations in the AlN single crystal may be less than approximately $1\times10^6$ cm$^{-2}$, less than approximately $1\times10^5$ cm$^{-2}$, less than approximately $1\times10^4$ cm$^{-2}$, less than approximately $1\times10^3$ cm$^{-2}$, or less than approximately $1\times10^2$ cm$^{-2}$. A density of threading screw dislocations in the AlN single crystal may be less than approximately 1000 cm$^{-2}$, less than approximately 100 cm$^{-2}$, less than approximately 10 cm$^{-2}$, or less than approximately 1 cm$^{-2}$. The AlN single crystal may exhibit an x-ray rocking curve having a full width at half maximum value less than 200 arcsec, less than 100 arcsec, less than 75 arcsec, less than 50 arcsec, or less than 40 arcsec. A carbon concentration within the AlN single crystal may be less than $5\times10^{18}$ cm$^{-3}$, less than $1\times10^{18}$ cm$^{-3}$, less than $5\times10^{17}$ cm$^{-3}$, less than $1\times10^{17}$ cm$^{-3}$, less than $5\times10^{16}$ cm$^{-3}$, or less than $1\times10^{16}$ cm$^{-3}$. A thermal conductivity of the AlN single crystal, as measured in accordance with the American Society for Testing and Materials (ASTM) Standard E1461-13, may be greater than approximately 200 W/m·K, greater than approximately 250 W/m·K, greater than approximately 290 W/m·K, or greater than approximately 310 W/m·K.

The AlN single crystal may have an Urbach energy ranging from approximately 0.2 eV to approximately 1.8 eV within an incident photon energy range of 5.85 eV to 6.0 eV. The Urbach energy $E_U$ may be defined by: ln $$\alpha = \ln\alpha_0 + \left(\frac{h\nu}{E_U}\right),$$

where $\alpha$ is an absorption coefficient of the AlN single crystal at an incident photon energy $h\nu$, and $\alpha_0$ is a constant corresponding to the absorption coefficient at zero photon energy. The Urbach energy of the AlN single crystal may range from approximately 0.21 eV to approximately 1.0 eV. The AlN single crystal may have an ultraviolet (UV) absorption coefficient of less than 10 cm$^{-1}$ for an entire wavelength range of 220 nm to 280 nm. The UV absorption coefficient may be no less than approximately 5 cm$^{-1}$ for the entire wavelength range of 220 nm to 280 nm. The AlN single crystal may have an ultraviolet (UV) absorption coefficient of less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. The AlN single crystal may have an ultraviolet (UV) absorption coefficient of less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. The AlN single crystal may have an ultraviolet (UV) absorption coefficient of less than 20 cm$^{-1}$ for an entire wavelength range of 215 nm to 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. The AlN single crystal may have an ultraviolet (UV) absorption coefficient of less than 20 cm$^{-1}$ for a wavelength of 220 nm. The UV absorption coefficient may be no less than approximately 5 cm$^{-1}$ for the wavelength of 220 nm. The AlN single crystal may have an ultraviolet (UV) absorption coefficient of less than 15 cm$^{-1}$ for an entire wavelength range of 220 nm to 240 nm. The UV absorption coefficient may be no less than approximately 5 cm$^{-1}$ for the entire wavelength range of 220 nm to 240 nm. The AlN single crystal may have an ultraviolet (UV) absorption coefficient of less than 15 cm$^{-1}$ for an entire wavelength range of 220 nm to 230 nm. The UV absorption coefficient may be no less than approximately 5 cm$^{-1}$ for the entire wavelength range of 220 nm to 230 nm. The AlN single crystal may have an ultraviolet (UV) absorption coefficient of less than 10 cm$^{-1}$ for a wavelength of 230 nm. The UV absorption coefficient may be no less than approximately 5 cm$^{-1}$ for the wavelength of 230 nm.

The minimum diameter of the AlN single crystal may be at least approximately 25 mm, at least approximately 50 mm, at least approximately 60 mm, at least approximately 75 mm, or at least approximately 100 mm. The maximum diameter of the AlN single crystal may be at least approximately 25 mm, at least approximately 50 mm, at least approximately 60 mm, at least approximately 75 mm, at least approximately 100 mm, at least approximately 125 mm, or at least approximately 150 mm.

In another aspect, embodiments of the invention feature an AlN single crystal having a mass greater than 78 grams.

Embodiments of the invention may include one or more of the following in any of a variety of combinations. The mass may be greater than approximately 100 grams, greater than approximately 140 grams, greater than approximately 200 grams, greater than approximately 220 grams, greater than approximately 240 grams, greater than approximately 250 grams, greater than approximately 300 grams, greater than approximately 400 grams, greater than approximately 500 grams, greater than approximately 600 grams, greater than approximately 700 grams, greater than approximately 800 grams, greater than approximately 900 grams, or greater than approximately 1000 grams. The mass may be less than approximately 2000 grams, less than approximately 1500 grams, or less than approximately 1400 grams. The minimum diameter of the AlN single crystal may be at least approximately 25 mm, at least approximately 50 mm, at least approximately 60 mm, at least approximately 75 mm, or at least approximately 100 mm. The maximum diameter of the AlN single crystal may be at least approximately 25 mm, at least approximately 50 mm, at least approximately 60 mm, at least approximately 75 mm, at least approximately 100 mm, at least approximately 125 mm, or at least approximately 150 mm.

A density of threading edge dislocations in the AlN single crystal may be less than approximately $1 \times 10^6$ cm$^{-2}$, less than approximately $1 \times 10^5$ cm$^{-2}$, less than approximately $1 \times 10^4$ cm$^{-2}$, less than approximately $1 \times 10^3$ cm$^{-2}$, or less than approximately $1 \times 10^2$ cm$^{-2}$. A density of threading screw dislocations in the AlN single crystal may be less than approximately 1000 cm$^{-2}$, less than approximately 100 cm$^{-2}$, less than approximately 10 cm$^{-2}$, or less than approximately 1 cm$^{-2}$. The AlN single crystal may exhibit an x-ray rocking curve having a full width at half maximum value less than 200 arcsec, less than 100 arcsec, less than 75 arcsec, less than 50 arcsec, or less than 40 arcsec. A carbon concentration within the AlN single crystal may be less than $5 \times 10^{18}$ cm$^{-3}$, less than $1 \times 10^{18}$ cm$^{-3}$, less than $5 \times 10^{17}$ cm$^{-3}$, less than $1 \times 10^{17}$ cm$^{-3}$, less than $5 \times 10^{16}$ cm$^{-3}$, or less than $1 \times 10^{16}$ cm$^{-3}$. A thermal conductivity of the AlN single crystal, as measured in accordance with the American Society for Testing and Materials (ASTM) Standard E1461-13, may be greater than approximately 200 W/m·K, greater than approximately 250 W/m·K, greater than approximately 290 W/m·K, or greater than approximately 310 W/m·K.

The AlN single crystal may have an Urbach energy ranging from approximately 0.2 eV to approximately 1.8 eV within an incident photon energy range of 5.85 eV to 6.0 eV. The Urbach energy $E_U$ may be defined by:

$$\ln \alpha = \ln \alpha_0 + \left(\frac{h\nu}{E_U}\right),$$

where $\alpha$ is an absorption coefficient of the AlN single crystal at an incident photon energy $h\nu$, and $\alpha_0$ is a constant corresponding to the absorption coefficient at zero photon energy. The Urbach energy of the AlN single crystal may range from approximately 0.21 eV to approximately 1.0 eV. The AlN single crystal may have an ultraviolet (UV) absorption coefficient of less than 10 cm$^{-1}$ for an entire wavelength range of 220 nm to 280 nm. The UV absorption coefficient may be no less than approximately 5 cm$^{-1}$ for the entire wavelength range of 220 nm to 280 nm. The AlN single crystal may have an ultraviolet (UV) absorption coefficient of less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. The AlN single crystal may have an ultraviolet (UV) absorption coefficient of less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. The AlN single crystal may have an ultraviolet (UV) absorption coefficient of less than 20 cm$^{-1}$ for an entire wavelength range of 215 nm to 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. The AlN single crystal may have an ultraviolet (UV) absorption coefficient of less than 20 cm$^{-1}$ for a wavelength of 220 nm. The UV absorption coefficient may be no less than approximately 5 cm$^{-1}$ for the wavelength of 220 nm. The AlN single crystal may have an ultraviolet (UV) absorption coefficient of less than 15 cm$^{-1}$ for an entire wavelength range of 220 nm to 240 nm. The UV absorption coefficient may be no less than approximately 5 cm$^{-1}$ for the entire wavelength range of 220 nm to 240 nm. The AlN single crystal may have an ultraviolet (UV) absorption coefficient of less than 15 cm$^{-1}$ for an entire wavelength range of 220 nm to 230 nm. The UV absorption coefficient may be no less than approximately 5 cm$^{-1}$ for the entire wavelength range of 220 nm to 230 nm. The AlN single crystal may have an ultraviolet (UV) absorption coefficient of less than 10 cm$^{-1}$ for a wavelength of 230 nm. The UV absorption coefficient may be no less than approximately 5 cm$^{-1}$ for the wavelength of 230 nm.

The AlN single crystal may have a diameter that increases, along at least a portion of a length of the AlN single crystal, from a minimum diameter to a maximum diameter. The AlN single crystal may have a crystal augmentation parameter (CAP), in mm, greater than 20. The CAP may be defined by:

$$CAP = \frac{A_E - A_S}{L_E} = \frac{\pi}{4 \times L_E}(d_E^2 - d_S^2),$$

where $A_E$, in mm$^2$, is the cross-sectional area of the AlN single crystal at the maximum diameter, $d_E$ is the maximum diameter of the AlN single crystal in mm, $A_S$, in mm$^2$, is the cross-sectional area of the AlN single crystal at the minimum diameter, $d_S$ is the minimum diameter in mm, and $L_E$ is an expansion length, in mm, of the at least a portion of the AlN single crystal along which the diameter increases from the minimum diameter to the maximum diameter. A ratio of a total length of the AlN single crystal, in mm, to a maximum diameter of the AlN single crystal, in mm, may range from approximately 0.3 to approximately 0.6. A ratio of a total length of the AlN single crystal, in mm, to a maximum diameter of the AlN single crystal, in mm, may range from approximately 0.35 to approximately 0.55.

The AlN single crystal may have a diameter that increases, along at least a portion of a length of the AlN single crystal, from a minimum diameter to a maximum diameter. The AlN single crystal may have an expansion length corresponding to a length of the at least a portion of the AlN single crystal along which the diameter increases from the minimum diameter to the maximum diameter. A ratio of expansion length of the AlN single crystal, in mm, to the maximum diameter, in mm, may range from approximately 0.002 to approximately 0.4. A ratio of expansion length of the AlN single crystal, in mm, to the maximum diameter, in mm, may range from approximately 0.002 to approximately 0.03. A ratio of expansion length of the AlN single crystal, in mm, to the maximum diameter, in mm, may range from approximately 0.07 to approximately 0.3. A ratio of the expansion length of the AlN single crystal, in mm, to the maximum diameter, in mm, may range from approximately 0.002 to approximately 0.02. A ratio of the expansion length of the AlN single crystal, in mm, to the maximum diameter, in mm, may range from approximately 0.08 to approximately 0.5. A ratio of the expansion length of the AlN single crystal, in mm, to the maximum diameter, in mm, may range from approximately 0.1 to approximately 0.3.

A first region of the AlN single crystal may be shaped as a frustum. A second region of the AlN single crystal may be shaped as a dome or cone or frustum extending from the first region (and having a diameter that decreases in a direction away from the first region). A second region of the AlN single crystal may be shaped as a cylinder extending from the first region and having a substantially constant diameter. A third region of the AlN single crystal is shaped as a dome or cone or frustum extending from the second region (and having a diameter that decreases in a direction away from the first and second regions).

In yet another aspect, embodiments of the invention feature an AlN single crystal having a volume greater than 24 cm$^3$.

Embodiments of the invention may include one or more of the following in any of a variety of combinations. The volume may be greater than approximately 30 cm$^3$, greater than approximately 40 cm$^3$, greater than approximately 70 cm$^3$, greater than approximately 75 cm$^3$, greater than approximately 80 cm$^3$, greater than approximately 100 cm$^3$, greater than approximately 150 cm$^3$, greater than approximately 200 cm$^3$, greater than approximately 250 cm$^3$, greater than approximately 300 cm$^3$, greater than approximately 350 cm$^3$, or greater than approximately 400 cm$^3$. The volume may be less than approximately 800 cm$^3$, or less than approximately 500 cm$^3$. The minimum diameter of the AlN single crystal may be at least approximately 25 mm, at least approximately 50 mm, at least approximately 60 mm, at least approximately 75 mm, or at least approximately 100 mm. The maximum diameter of the AlN single crystal may be at least approximately 25 mm, at least approximately 50 mm, at least approximately 60 mm, at least approximately 75 mm, at least approximately 100 mm, at least approximately 125 mm, or at least approximately 150 mm.

A density of threading edge dislocations in the AlN single crystal may be less than approximately $1 \times 10^6$ cm$^{-2}$, less than approximately $1 \times 10^5$ cm$^{-2}$, less than approximately $1 \times 10^4$ cm$^{-2}$, less than approximately $1 \times 10^3$ cm$^{-2}$, or less than approximately $1 \times 10^2$ cm$^{-2}$. A density of threading screw dislocations in the AlN single crystal may be less than approximately 1000 cm$^{-2}$, less than approximately 100 cm$^{-2}$, less than approximately 10 cm$^{-2}$, or less than approximately 1 cm$^{-2}$. The AlN single crystal may exhibit an x-ray rocking curve having a full width at half maximum value less than 200 arcsec, less than 100 arcsec, less than 75 arcsec, less than 50 arcsec, or less than 40 arcsec. A carbon concentration within the AlN single crystal may be less than $5 \times 10^{18}$ cm$^{-3}$, less than $1 \times 10^{18}$ cm$^{-3}$, less than $5 \times 10^{17}$ cm$^{-3}$, less than $1 \times 10^{17}$ cm$^{-3}$, less than $5 \times 10^{16}$ cm$^{-3}$, or less than $1 \times 10^{16}$ cm$^{-3}$. A thermal conductivity of the AlN single crystal, as measured in accordance with the American Society for Testing and Materials (ASTM) Standard E1461-13, may be greater than approximately 200 W/m·K, greater than approximately 250 W/m·K, greater than approximately 290 W/m·K, or greater than approximately 310 W/m·K.

The AlN single crystal may have an Urbach energy ranging from approximately 0.2 eV to approximately 1.8 eV within an incident photon energy range of 5.85 eV to 6.0 eV. The Urbach energy $E_U$ may be defined by:

$$\ln \alpha = \ln \alpha_0 + \left(\frac{hv}{E_U}\right),$$

where $\alpha$ is an absorption coefficient of the AlN single crystal at an incident photon energy $hv$, and $\alpha_0$ is a constant corresponding to the absorption coefficient at zero photon energy. The Urbach energy of the AlN single crystal may range from approximately 0.21 eV to approximately 1.0 eV. The AlN single crystal may have an ultraviolet (UV) absorption coefficient of less than 10 cm$^{-1}$ for an entire wavelength range of 220 nm to 280 nm. The UV absorption coefficient may be no less than approximately 5 cm$^{-1}$ for the entire wavelength range of 220 nm to 280 nm. The AlN single crystal may have an ultraviolet (UV) absorption coefficient of less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. The AlN single crystal may have an ultraviolet (UV) absorption coefficient of less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. The AlN single crystal may have an ultraviolet (UV) absorption coefficient of less than 20 cm$^{-1}$ for an entire wavelength range of 215 nm to 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. The AlN single crystal may have an ultraviolet (UV) absorption coefficient of less than 20 cm$^{-1}$ for a wavelength of 220 nm. The UV absorption coefficient may be no less than approximately 5 cm$^{-1}$ for the wavelength of 220 nm. The AlN single crystal may have an ultraviolet (UV) absorption coefficient of less than 15 cm$^{-1}$ for an entire wavelength range of 220 nm to 240 nm. The UV absorption coefficient may be no less than approximately 5 cm$^{-1}$ for the entire wavelength range of 220 nm to 240 nm. The AlN single crystal may have an ultraviolet (UV) absorption coefficient of less than 15 cm$^{-1}$ for an entire wavelength range of 220 nm to 230 nm. The UV absorption coefficient may be no less than approximately 5 cm$^{-1}$ for the entire wavelength range of 220 nm to 230 nm. The AlN single crystal may have an ultraviolet (UV) absorption coefficient of less than 10 cm$^{-1}$ for a wavelength of 230 nm. The UV absorption coefficient may be no less than approximately 5 cm$^{-1}$ for the wavelength of 230 nm.

The AlN single crystal may have a diameter that increases, along at least a portion of a length of the AlN single crystal, from a minimum diameter to a maximum diameter. The AlN single crystal may have a crystal augmentation parameter (CAP), in mm, greater than 20. The CAP may be defined by:

$$CAP = \frac{A_E - A_S}{L_E} = \frac{\pi}{4 \times L_E}(d_E^2 - d_S^2),$$

where $A_E$, in mm$^2$, is the cross-sectional area of the AlN single crystal at the maximum diameter, $d_E$ is the maximum diameter of the AlN single crystal in mm, $A_S$, in mm$^2$, is the cross-sectional area of the AlN single crystal at the minimum diameter, $d_S$ is the minimum diameter in mm, and $L_E$ is an expansion length, in mm, of the at least a portion of the AlN single crystal along which the diameter increases from the minimum diameter to the maximum diameter. A ratio of a total length of the AlN single crystal, in mm, to a maximum diameter of the AlN single crystal, in mm, may range from approximately 0.3 to approximately 0.6. A ratio of a total length of the AlN single crystal, in mm, to a maximum diameter of the AlN single crystal, in mm, may range from approximately 0.35 to approximately 0.55.

The AlN single crystal may have a diameter that increases, along at least a portion of a length of the AlN single crystal, from a minimum diameter to a maximum diameter. The AlN single crystal may have an expansion length corresponding to a length of the at least a portion of the AlN single crystal along which the diameter increases from the minimum diameter to the maximum diameter. A ratio of expansion length of the AlN single crystal, in mm, to the maximum diameter, in mm, may range from approximately 0.002 to approximately 0.4. A ratio of expansion length of the AlN single crystal, in mm, to the maximum diameter, in mm, may range from approximately 0.002 to approximately 0.03. A ratio of expansion length of the AlN single crystal, in mm, to the maximum diameter, in mm, may range from approximately 0.07 to approximately 0.3. A ratio of the expansion length of the AlN single crystal, in mm, to the maximum diameter, in mm, may range from approximately 0.002 to approximately 0.02. A ratio of the expansion length of the AlN single crystal, in mm, to the maximum diameter, in mm, may range from approximately 0.08 to approximately 0.5. A ratio of the expansion length of the AlN single crystal, in mm, to the maximum diameter, in mm, may range from approximately 0.1 to approximately 0.3.

A first region of the AlN single crystal may be shaped as a frustum. A second region of the AlN single crystal may be shaped as a dome or cone or frustum extending from the first region (and having a diameter that decreases in a direction away from the first region). A second region of the AlN single crystal may be shaped as a cylinder extending from the first region and having a substantially constant diameter. A third region of the AlN single crystal is shaped as a dome or cone or frustum extending from the second region (and having a diameter that decreases in a direction away from the first and second regions).

In another aspect, embodiments of the invention feature a method of forming single-crystal aluminum nitride (AlN). A seed crystal having a growth face that includes, consists essentially of, or consists of AlN is provided within a growth chamber. A radial thermal gradient and an axial thermal gradient are established within the growth chamber. Vapor including, consisting essentially of, or consisting of aluminum and nitrogen is condensed within the growth chamber, thereby forming on the growth face of the seed crystal an AlN single crystal that (a) increases in length along a growth direction in response to the axial thermal gradient and (b) expands in diameter along a radial direction substantially perpendicular to the growth direction in response to the radial thermal gradient. During formation of the AlN single crystal, a lateral growth rate of the AlN single crystal is increased to increase a rate of the diameter expansion of the AlN single crystal.

Embodiments of the invention may include one or more of the following in any of a variety of combinations. Establishing the radial thermal gradient and the axial thermal gradient within the growth chamber may include, consist essentially of, or consist of, at least in part, (i) heating the growth chamber and (ii) configuring a plurality of thermal shields outside of the growth chamber. Increasing the lateral growth rate of the AlN single crystal may include, consist essentially of, or consist of enhancing the vapor with atomic nitrogen proximate an edge portion of the AlN single crystal. Enhancing the vapor with atomic nitrogen include, consist essentially of, or consist of (i) introducing nitrogen (and/or nitrogen-containing) gas proximate an edge portion of the AlN single crystal and (ii) generating a plasma proximate the edge portion of the AlN single crystal with the nitrogen (and/or nitrogen-containing) gas.

Increasing the lateral growth rate of the AlN single crystal may include, consist essentially of, or consist of providing, within the growth chamber, one or more internal thermal shields for directing heat toward an edge of the AlN single crystal. At least one (or even all) said internal thermal shield may be oriented substantially parallel (e.g., ±5°, ±4°, ±3°, ±2°, ±1°, or ±0.5°) to the radial direction. At least one (or even all) said internal thermal shield may be oriented substantially parallel (e.g., ±5°, ±4°, ±3°, ±2°, ±1°, or ±0.5°) to the growth direction. At least one (or even all) said internal thermal shield may be oriented at an inclination neither parallel nor perpendicular to the radial direction. At least one (or even all) said internal thermal shield may be annular and define therein a central opening to accommodate growth of the AlN single crystal therethrough. The one or more internal thermal shields may include, consist essentially of, or consist of a plurality of internal thermal shields. Thicknesses of at least two (or even all) of the internal thermal shields may be different from each other. Densities of at least two of the internal thermal shields may be different from each other. Each internal thermal shield may be annular and define a central opening therein. Sizes of the central openings of at least two (or even all) of the internal thermal shields may be different from each other.

A single-crystal AlN substrate may be separated from the AlN single crystal. The single-crystal AlN substrate may have a diameter of at least 25 mm, at least 50 mm, at least 75 mm, or at least 100 mm. A light-emitting device may be fabricated over at least a portion of the AlN substrate. The light-emitting device may be configured to emit ultraviolet light. At least a portion off the AlN substrate may be removed from the light-emitting device after or during fabrication of the light-emitting device.

In yet another aspect, embodiments of the invention feature a method of forming single-crystal aluminum nitride (AlN). A seed crystal having a growth face that includes, consists essentially of, or consists of AlN is provided within a growth chamber. The growth chamber is heated. Vapor including, consisting essentially of, or consisting of aluminum and nitrogen is condensed within the growth chamber during heating thereof, thereby forming an AlN single crystal on the growth face of the seed crystal. During formation of the AlN single crystal, the vapor is enhanced with atomic nitrogen proximate an edge portion of the AlN single crystal.

Embodiments of the invention may include one or more of the following in any of a variety of combinations. Enhancing the vapor with atomic nitrogen may include, consist essentially of, or consist of (i) introducing nitrogen (and/or nitrogen-containing) gas into the growth chamber and (ii) generating a plasma proximate the edge portion of the AlN single crystal with the nitrogen (and/or nitrogen-containing) gas. A single-crystal AlN substrate may be separated from the AlN single crystal. The single-crystal AlN substrate may have a diameter of at least 25 mm, at least 50 mm, at least 75 mm, or at least 100 mm. A light-emitting device may be fabricated over at least a portion of the AlN substrate. The light-emitting device may be configured to emit ultraviolet light. At least a portion off the AlN substrate may be removed from the light-emitting device after or during fabrication of the light-emitting device.

In another aspect, embodiments of the invention feature embodiments of the invention feature a method of forming single-crystal aluminum nitride (AlN). A seed crystal having a growth face that includes, consists essentially of, or consists of AlN is provided within a growth chamber. The growth chamber is heated. Vapor including, consisting essentially of, or consisting of aluminum and nitrogen is condensed within the growth chamber during heating thereof, thereby forming an AlN single crystal on the growth face of the seed crystal. The AlN single crystal extends from the seed crystal in an axial direction perpendicular to the growth face. During formation of the AlN single crystal, heat is directed toward an edge portion of the AlN single crystal with one or more internal thermal shields disposed within the growth chamber.

Embodiments of the invention may include one or more of the following in any of a variety of combinations. One or more, or a plurality of external thermal shields may be disposed outside of the growth chamber. During heating of the growth chamber, one or more thermal gradients may be established within the growth chamber. The one or more thermal gradients may be established, at least in part, via differential furnace heating and/or differential insulation outside the growth chamber. The one or more thermal gradients may be established, at least in part, via a configuration of one or more external thermal shields disposed outside of the growth chamber. The vapor may be enhanced with atomic nitrogen proximate the edge portion of the AlN single crystal. Enhancing the vapor with atomic nitrogen may include, consist essentially of, or consist of (i) introducing nitrogen (and/or nitrogen-containing) gas into the growth chamber and (ii) generating a plasma proximate the edge portion of the AlN single crystal with the nitrogen (and/or nitrogen-containing) gas.

At least one (or even all) said internal thermal shield may be oriented substantially parallel (e.g., ±5°, ±4°, ±3°, ±2°, ±1°, or ±0.5°) to the axial direction. At least one (or even all) said internal thermal shield may be oriented substantially perpendicular (e.g., ±5°, ±4°, ±3°, ±2°, ±1°, or ±0.5°) to the axial direction. At least one (or even all) said internal thermal shield may be oriented at an inclination neither parallel nor perpendicular to the axial direction. At least one (or even all) said internal thermal shield may be annular and define therein a central opening to accommodate growth of the AlN single crystal therethrough. The one or more internal thermal shields may include, consist essentially of, or consist of a plurality of internal thermal shields. Thicknesses of at least two (or even all) of the internal thermal shields may be different from each other. Densities of at least two of the internal thermal shields may be different from each other. Each internal thermal shield may be annular and define a central opening therein. Sizes of the central openings of at least two (or even all) of the internal thermal shields may be different from each other.

A single-crystal AlN substrate may be separated from the AlN single crystal. The single-crystal AlN substrate may have a diameter of at least 25 mm, at least 50 mm, at least 75 mm, or at least 100 mm. A light-emitting device may be fabricated over at least a portion of the AlN substrate. The light-emitting device may be configured to emit ultraviolet light. At least a portion off the AlN substrate may be removed from the light-emitting device after or during fabrication of the light-emitting device.

In yet another aspect, embodiments of the invention feature a method of forming single-crystal aluminum nitride (AlN). A seed crystal having a growth face that includes, consists essentially of, or consists of AlN is provided within a growth chamber. In internal support is provided within the growth chamber. The internal support defines an opening to accommodate growth of the AlN single crystal therethrough. One or more internal thermal shields are provided within the growth chamber. Each internal thermal shield is at least partially supported by the internal support. The growth chamber is heated. Vapor including, consisting essentially of, or consisting of aluminum and nitrogen is condensed within the growth chamber during heating thereof, thereby forming an AlN single crystal on the growth face of the seed crystal. The AlN single crystal extends from the seed crystal in an axial direction perpendicular to the growth face.

Embodiments of the invention may include one or more of the following in any of a variety of combinations. At least a portion of the internal support may be frusto-conical. The vapor may be enhanced with atomic nitrogen proximate the edge portion of the AlN single crystal. Enhancing the vapor with atomic nitrogen may include, consist essentially of, or consist of (i) introducing nitrogen (and/or nitrogen-containing) gas into the growth chamber and (ii) generating a plasma proximate the edge portion of the AlN single crystal with the nitrogen (and/or nitrogen-containing) gas.

At least one (or even all) said internal thermal shield may be oriented substantially parallel (e.g., ±5°, ±4°, ±3°, ±2°, ±1°, or ±0.5°) to the axial direction. At least one (or even all) said internal thermal shield may be oriented substantially perpendicular (e.g., ±5°, ±4°, ±3°, ±2°, ±1°, or ±0.5°) to the axial direction. At least one (or even all) said internal thermal shield may be oriented at an inclination neither parallel nor perpendicular to the axial direction. At least one (or even all) said internal thermal shield may be annular and define therein a central opening to accommodate growth of the AlN single crystal therethrough. The one or more internal thermal shields may include, consist essentially of, or consist of a plurality of internal thermal shields. Thicknesses of at least two (or even all) of the internal thermal shields may be different from each other. Densities of at least two of the internal thermal shields may be different from each other. Each internal thermal shield may be annular and define a central opening therein. Sizes of the central openings of at least two (or even all) of the internal thermal shields may be different from each other.

A single-crystal AlN substrate may be separated from the AlN single crystal. The single-crystal AlN substrate may have a diameter of at least 25 mm, at least 50 mm, at least 75 mm, or at least 100 mm. A light-emitting device may be fabricated over at least a portion of the AlN substrate. The light-emitting device may be configured to emit ultraviolet light. At least a portion off the AlN substrate may be removed from the light-emitting device after or during fabrication of the light-emitting device.

In another aspect, embodiments of the invention feature an AlN single crystal having a diameter that increases, along at least a portion of a length of the AlN single crystal, from a minimum diameter to a maximum diameter. The AlN single crystal has a crystal augmentation parameter (CAP), in mm, greater than 20 and less than 44. The CAP is defined by:

$$CAP = \frac{A_E - A_S}{L_E} = \frac{\pi}{4 \times L_E}(d_E^2 - d_S^2).$$

$A_E$, in mm$^2$, is the cross-sectional area of the AlN single crystal at the maximum diameter, $d_E$ is the maximum diameter of the AlN single crystal in mm, $A_S$, in mm$^2$, is the cross-sectional area of the AlN single crystal at the minimum diameter, $d_S$ is the minimum diameter in mm, and $L_E$ is an expansion length, in mm, of the at least a portion of the AlN single crystal along which the diameter increases from the minimum diameter to the maximum diameter. The $L_E$ of the AlN single crystal may be at least 14 mm. The AlN single crystal may have an expanded portion having the maximum diameter, the length of the expanded portion may be greater than $L_E$, and the sum of the length of the expanded portion and $L_E$ may be at least 14 mm.

Embodiments of the invention may include one or more of the following in any of a variety of combinations. The CAP may be greater than 25, greater than 30, greater than 40, greater than 50, greater than 90, greater than 100, greater than 250, greater than 500, greater than 750, or greater than 1000. The CAP may be less than 3000, less than 2500, less than 2000, less than 1500, less than 1000, less than 800, less than 500, less than 300, less than 200, less than 100, or less than 50. The $L_E$ may be at least 15 mm. The sum of the length of the expanded portion and $L_E$ may be at least 15 mm. The AlN single crystal may have the expanded portion having the maximum diameter, the length of the expanded portion may be greater than $L_E$, and the sum of the length of the expanded portion and $L_E$ may be at least 22 mm, or at least 25 mm. The $L_E$ may be at most 30 mm. The sum of the length of the expanded portion and $L_E$ may be at most 30 mm.

A first region of the AlN single crystal may be shaped as a frustum. A maximum diameter of the frustum may correspond to the maximum diameter of the AlN single crystal and the minimum diameter of the frustum may correspond to the minimum diameter of the AlN single crystal. A second region of the AlN single crystal may be shaped as a dome or cone or frustum extending from the first region. A maximum diameter of the dome or cone or frustum may correspond to the maximum diameter of the AlN single crystal (and/or to the maximum diameter of the first region).

A first region of the AlN single crystal may be shaped as a frustum. A maximum diameter of the frustum may correspond to the maximum diameter of the AlN single crystal and the minimum diameter of the frustum may correspond to the minimum diameter of the AlN single crystal. A second region of the AlN single crystal may be shaped as a cylinder extending from the first region and having a diameter corresponding to the maximum diameter of the AlN single crystal. A third region of the AlN single crystal may be shaped as a dome or cone or frustum extending from the second region. A maximum diameter of the dome or cone or frustum may correspond to the maximum diameter of the AlN single crystal (and/or to the maximum diameter of the first region and/or to the diameter of the second region).

A density of threading edge dislocations in the AlN single crystal may be less than approximately $1\times10^6$ cm$^{-2}$, less than approximately $1\times10^5$ cm$^{-2}$, less than approximately $1\times10^4$ cm$^{-2}$, less than approximately $1\times10^3$ cm$^{-2}$, or less than approximately $1\times10^2$ cm$^{-2}$. A density of threading screw dislocations in the AlN single crystal may be less than approximately 1000 cm$^{-2}$, less than approximately 100 cm$^{-2}$, less than approximately 10 cm$^{-2}$, or less than approximately 1 cm$^{-2}$. The AlN single crystal may exhibit an x-ray rocking curve having a full width at half maximum value less than 200 arcsec, less than 100 arcsec, less than 75 arcsec, less than 50 arcsec, or less than 40 arcsec. A carbon concentration within the AlN single crystal may be less than $5\times10^{18}$ cm$^{-3}$, less than $1\times10^{18}$ cm$^{-3}$, less than $5\times10^{17}$ cm$^{-3}$, less than $1\times10^{17}$ cm$^{-3}$, less than $5\times10^{16}$ cm$^{-3}$, or less than $1\times10^{16}$ cm$^{-3}$. A thermal conductivity of the AlN single crystal, as measured in accordance with the American Society for Testing and Materials (ASTM) Standard E1461-13, may be greater than approximately 200 W/m·K, greater than approximately 250 W/m·K, greater than approximately 290 W/m·K, or greater than approximately 310 W/m·K.

The AlN single crystal may have an Urbach energy ranging from approximately 0.2 eV to approximately 1.8 eV within an incident photon energy range of 5.85 eV to 6.0 eV. The Urbach energy $E_U$ may be defined by:

$$\ln \alpha = \ln \alpha_0 + \left(\frac{h\nu}{E_U}\right),$$

where $\alpha$ is an absorption coefficient of the AlN single crystal at an incident photon energy h$\nu$, and $\alpha_0$ is a constant corresponding to the absorption coefficient at zero photon energy. The Urbach energy of the AlN single crystal may range from approximately 0.21 eV to approximately 1.0 eV. The AlN single crystal may have an ultraviolet (UV) absorption coefficient of less than 10 cm$^{-1}$ for an entire wavelength range of 220 nm to 280 nm. The UV absorption coefficient may be no less than approximately 5 cm$^{-1}$ for the entire wavelength range of 220 nm to 280 nm. The AlN single crystal may have an ultraviolet (UV) absorption coefficient of less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. The AlN single crystal may have an ultraviolet (UV) absorption coefficient of less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. The AlN single crystal may have an ultraviolet (UV) absorption coefficient of less than 20 cm$^{-1}$ for an entire wavelength range of 215 nm to 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. The AlN single crystal may have an ultraviolet (UV) absorption coefficient of less than 20 cm$^{-1}$ for a wavelength of 220 nm. The UV absorption coefficient may be no less than approximately 5 cm$^{-1}$ for the wavelength of 220 nm. The AlN single crystal may have an ultraviolet (UV) absorption coefficient of less than 15 cm$^{-1}$ for an entire wavelength range of 220 nm to 240 nm. The UV absorption coefficient may be no less than approximately 5 cm$^{-1}$ for the entire wavelength range of 220 nm to 240 nm. The AlN single crystal may have an ultraviolet (UV) absorption coefficient of less than 15 cm$^{-1}$ for an entire wavelength range of 220 nm to 230 nm. The UV absorption coefficient may be no less than approximately 5 cm$^{-1}$ for the entire wavelength range of 220 nm to 230 nm. The AlN single crystal may have an ultraviolet (UV) absorption coefficient of less than 10 cm$^{-1}$ for a wavelength of 230 nm. The UV absorption coefficient may be no less than approximately 5 cm$^{-1}$ for the wavelength of 230 nm.

The minimum diameter of the AlN single crystal may be at least approximately 25 mm, at least approximately 50 mm, at least approximately 60 mm, at least approximately 75 mm, or at least approximately 100 mm. The maximum diameter of the AlN single crystal may be at least approximately 25 mm, at least approximately 50 mm, at least approximately 60 mm, at least approximately 75 mm, at least approximately 100 mm, at least approximately 125 mm, or at least approximately 150 mm.

In yet another aspect, embodiments of the invention feature an AlN single-crystal substrate having a diameter of at least approximately 2.5 cm and having a substrate versatility (SuV) metric, in cm², greater than 3. The SuV metric is defined by:

$$SuV = \frac{A}{[\log(BPD+0.1)+1.1] \times 10^t} \cong \frac{0.785 d^2}{[\log(BPD+0.1)+1.1] \times 10^t}$$

A is the substrate area in cm², d is the substrate diameter in cm, t is the substrate thickness in cm, and BPD is the basal plane dislocation density, in cm⁻², in a center region of the substrate having an area greater than 1 mm².

Embodiments of the invention may include one or more of the following in any of a variety of combinations. The SuV metric may be less than 300, less than 250, less than 200, less than 185, less than 150, or less than 120. The SuV metric may be greater than 10, greater than 20, greater than 30, greater than 40, greater than 50, greater than 60, greater than 70, greater than 80, greater than 90, greater than 100, greater than 120, greater than 150, or greater than 170. The substate diameter may be at least approximately 3.5 cm, at least approximately 5 cm, at least approximately 7.5 cm, at least approximately 10 cm, or at least approximately 15 cm. The substate thickness may be at least approximately 0.05 cm. The basal plane dislocation density over the entire substrate area or in the center region may be approximately 0 cm⁻².

A density of threading edge dislocations in the AlN single-crystal substate may be less than approximately 1×10⁶ cm⁻², less than approximately 1×10⁵ cm⁻², less than approximately 1×10⁴ cm⁻², less than approximately 1×10³ cm⁻², or less than approximately 1×10² cm⁻². A density of threading screw dislocations in the AlN single-crystal substate may be less than approximately 1000 cm⁻², less than approximately 100 cm⁻², less than approximately 10 cm⁻², or less than approximately 1 cm⁻². The AlN single-crystal substate may exhibit an x-ray rocking curve having a full width at half maximum value less than 200 arcsec, less than 100 arcsec, less than 75 arcsec, less than 50 arcsec, or less than 40 arcsec. A carbon concentration within the AlN single-crystal substate may be less than 5×10¹⁸ cm⁻³, less than 1×10¹⁸ cm⁻³, less than 5×10¹⁷ cm⁻³, less than 1×10¹⁷ cm⁻³, less than 5×10¹⁶ cm⁻³, or less than 1×10¹⁶ cm⁻³. A thermal conductivity of the AlN single-crystal substate, as measured in accordance with the American Society for Testing and Materials (ASTM) Standard E1461-13, may be greater than approximately 200 W/m·K, greater than approximately 250 W/m·K, greater than approximately 290 W/m·K, or greater than approximately 310 W/m·K.

The AlN single-crystal substate may have an Urbach energy ranging from approximately 0.2 eV to approximately 1.8 eV within an incident photon energy range of 5.85 eV to 6.0 eV. The Urbach energy $E_U$ may be defined by:

$$\ln \alpha = \ln \alpha_0 + \left(\frac{h\nu}{E_U}\right),$$

where α is an absorption coefficient of the AlN single-crystal substate at an incident photon energy hν, and $\alpha_0$ is a constant corresponding to the absorption coefficient at zero photon energy. The Urbach energy of the AlN single-crystal substate may range from approximately 0.21 eV to approximately 1.0 eV. The AlN single-crystal substate may have an ultraviolet (UV) absorption coefficient of less than 10 cm⁻¹ for an entire wavelength range of 220 nm to 280 nm. The UV absorption coefficient may be no less than approximately 5 cm⁻¹ for the entire wavelength range of 220 nm to 280 nm. The AlN single-crystal substate may have an ultraviolet (UV) absorption coefficient of less than 30 cm⁻¹ for an entire wavelength range of 210 nm to 220 nm. The UV absorption coefficient may be no less than approximately 5 cm⁻¹ for the entire wavelength range of 210 nm to 220 nm. The AlN single-crystal substate may have an ultraviolet (UV) absorption coefficient of less than 8 cm⁻¹ for an entire wavelength range of 240 nm to 280 nm. The UV absorption coefficient may be no less than approximately 5 cm⁻¹ for the entire wavelength range of 240 nm to 280 nm. The AlN single-crystal substate may have an ultraviolet (UV) absorption coefficient of less than 20 cm⁻¹ for an entire wavelength range of 215 nm to 220 nm. The UV absorption coefficient may be no less than approximately 5 cm⁻¹ for the entire wavelength range of 215 nm to 220 nm. The UV absorption coefficient may be no less than approximately 10 cm⁻¹ for the entire wavelength range of 215 nm to 220 nm. The AlN single-crystal substate may have an ultraviolet (UV) absorption coefficient of less than 20 cm⁻¹ for a wavelength of 220 nm. The UV absorption coefficient may be no less than approximately 5 cm⁻¹ for the wavelength of 220 nm. The AlN single-crystal substate may have an ultraviolet (UV) absorption coefficient of less than 15 cm⁻¹ for an entire wavelength range of 220 nm to 240 nm. The UV absorption coefficient may be no less than approximately 5 cm⁻¹ for the entire wavelength range of 220 nm to 240 nm. The AlN single-crystal substate may have an ultraviolet (UV) absorption coefficient of less than 15 cm⁻¹ for an entire wavelength range of 220 nm to 230 nm. The UV absorption coefficient may be no less than approximately 5 cm⁻¹ for the entire wavelength range of 220 nm to 230 nm. The AlN single-crystal substate may have an ultraviolet (UV) absorption coefficient of less than 10 cm⁻¹ for a wavelength of 230 nm. The UV absorption coefficient may be no less than approximately 5 cm⁻¹ for the wavelength of 230 nm.

One or more electronic and/or optoelectronic devices may be disposed over the AlN single-crystal substrate. At least one such device may include, consist essentially of, or consist of a transistor, a light-emitting diode, or a laser. The light-emitting diode or laser may be configured to emit ultraviolet light. The perimeter of the AlN single-crystal substate may define a circle optionally having one or two flats (e.g., to indicate a crystalline orientation of the substrate). The center region of the substrate may have an area greater than 1 cm², greater than 3 cm², greater than 10 cm², greater than 20 cm², greater than 30 cm², greater than 40 cm², greater than 50 cm², greater than 60 cm², greater than 70 cm², greater than 72 cm², greater than 100 cm², greater than 120 cm², or greater than 150 cm².

In another aspect, embodiments of the invention feature an AlN single-crystal substrate having a diameter of at least 2.5 cm and having a basal plane dislocation density of less than 1 cm$^{-2}$ in a center region of the substrate having an area greater than 1 mm$^2$.

Embodiments of the invention may include one or more of the following in any of a variety of combinations. The substate diameter may be at least approximately 3.5 cm, at least approximately 5 cm, at least approximately 7.5 cm, at least approximately 10 cm, or at least approximately 15 cm. The substate thickness may be at least approximately 0.05 cm. The basal plane dislocation density over the entire substrate area or in the center region may be less than 0.5 cm$^{-2}$, less than 0.1 cm$^{-2}$, or approximately 0 cm$^{-2}$. The center region of the substrate may have an area greater than 1 cm$^2$, greater than 3 cm$^2$, greater than 10 cm$^2$, greater than 20 cm$^2$, greater than 30 cm$^2$, greater than 40 cm$^2$, greater than 50 cm$^2$, greater than 60 cm$^2$, greater than 70 cm$^2$, greater than 72 cm$^2$, greater than 100 cm$^2$, greater than 120 cm$^2$, or greater than 150 cm$^2$.

The AlN single-crystal substate may have an Urbach energy ranging from approximately 0.2 eV to approximately 1.8 eV within an incident photon energy range of 5.85 eV to 6.0 eV. The Urbach energy $E_U$ may be defined by:

$$\ln\alpha = \ln\alpha_0 + \left(\frac{h\nu}{E_U}\right),$$

where $\alpha$ is an absorption coefficient of the AlN single-crystal substate at an incident photon energy $h\nu$, and $\alpha_0$ is a constant corresponding to the absorption coefficient at zero photon energy. The Urbach energy of the AlN single-crystal substate may range from approximately 0.21 eV to approximately 1.0 eV. The AlN single-crystal substate may have an ultraviolet (UV) absorption coefficient of less than 10 cm$^{-1}$ for an entire wavelength range of 220 nm to 280 nm. The UV absorption coefficient may be no less than approximately 5 cm$^{-1}$ for the entire wavelength range of 220 nm to 280 nm. The AlN single-crystal substate may have an ultraviolet (UV) absorption coefficient of less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. The AlN single-crystal substate may have an ultraviolet (UV) absorption coefficient of less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. The AlN single-crystal substate may have an ultraviolet (UV) absorption coefficient of less than 20 cm$^{-1}$ for an entire wavelength range of 215 nm to 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. The AlN single-crystal substate may have an ultraviolet (UV) absorption coefficient of less than 20 cm$^{-1}$ for a wavelength of 220 nm. The UV absorption coefficient may be no less than approximately 5 cm$^{-1}$ for the wavelength of 220 nm. The AlN single-crystal substate may have an ultraviolet (UV) absorption coefficient of less than 15 cm$^{-1}$ for an entire wavelength range of 220 nm to 240 nm. The UV absorption coefficient may be no less than approximately 5 cm$^{-1}$ for the entire wavelength range of 220 nm to 240 nm. The AlN single-crystal substate may have an ultraviolet (UV) absorption coefficient of less than 15 cm$^{-1}$ for an entire wavelength range of 220 nm to 230 nm. The UV absorption coefficient may be no less than approximately 5 cm$^{-1}$ for the entire wavelength range of 220 nm to 230 nm. The AlN single-crystal substate may have an ultraviolet (UV) absorption coefficient of less than 10 cm$^{-1}$ for a wavelength of 230 nm. The UV absorption coefficient may be no less than approximately 5 cm$^{-1}$ for the wavelength of 230 nm.

One or more electronic and/or optoelectronic devices may be disposed over the AlN single-crystal substrate. At least one such device may include, consist essentially of, or consist of a transistor, a light-emitting diode, or a laser. The light-emitting diode or laser may be configured to emit ultraviolet light. The perimeter of the AlN single-crystal substate may define a circle optionally having one or two flats (e.g., to indicate a crystalline orientation of the substrate).

Embodiments of the invention may include AlN boules, wafers, and/or light-emitting devices formed or formable in accordance with any of the above methods.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6C-6H are white-beam topography images, in transmission geometry, of various AlN single crystals produced in accordance with various embodiments of the invention;

DETAILED DESCRIPTION

Figure 1A:
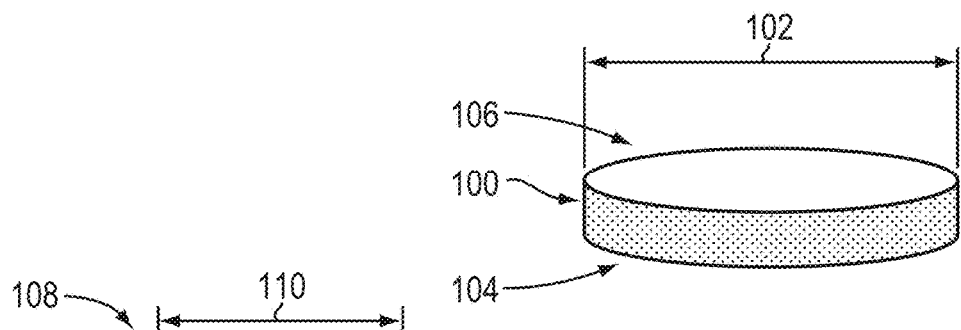
FIG. 1A is a schematic diagram of a seed crystal in accordance with various embodiments of the invention.
Figure 1B:
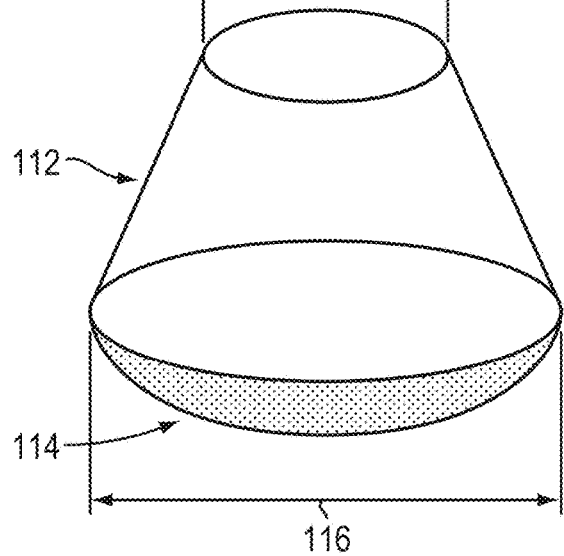
FIGS. 1B-1D are schematic diagrams of diameter-expanded bulk crystals in accordance with various embodiments of the invention.
Figure 1C:
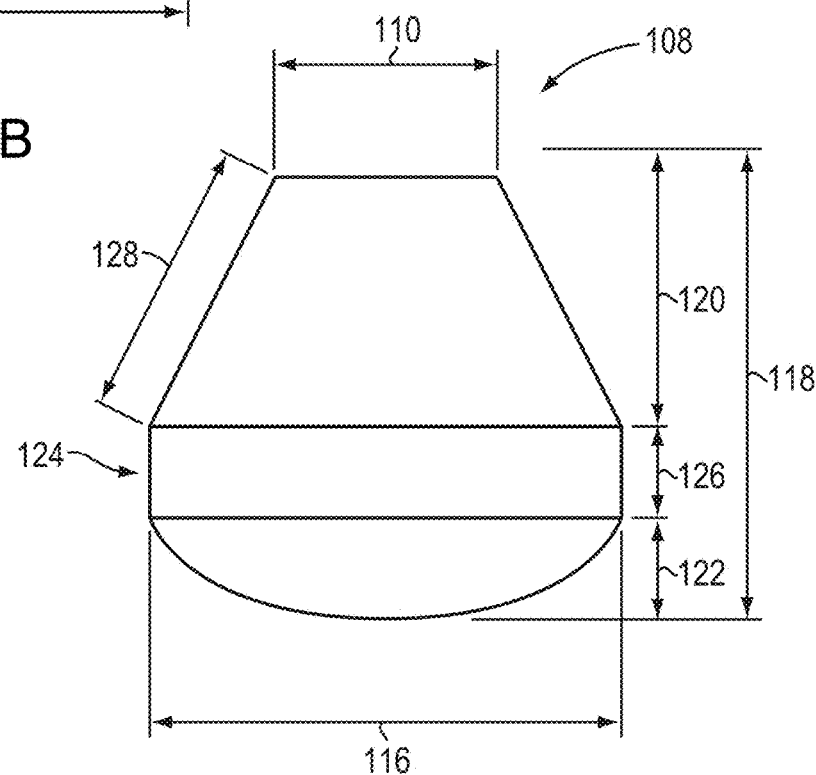

Embodiments of the present invention enable the fabrication of high-quality single-crystal AlN bulk crystals (i.e., boules and/or substrates) that undergo significant diameter expansion during crystal growth. FIGS. 1A-1C are schematic illustrations of various crystals, and associated parameters thereof, relevant to embodiments of the present invention. FIG. 1A depicts an exemplary seed crystal 100 having a diameter 102, a front surface 104, and a back surface 106. While the seed crystal 100 is depicted as cylindrical with circular surfaces, the seed crystal 100 is not limited to such shapes. As such, diameter 102 generally refers to the largest lateral dimension of the seed crystal 100, and may therefore correspond to a "width" or "maximum width," e.g., for seed crystals 100 having non-circular shapes. In various embodiments of the invention, the seed crystal 100 has a thickness ranging from approximately 0.1 mm to approximately 3 mm. Typically, the front surface 104 is exposed to the incoming vapor utilized for crystal growth, and the resulting crystal extends from the front surface 104. The seed crystal 100 may be mounted within the growth apparatus via the back surface 106 (see, e.g., FIG. 2). Depending upon the seed-mounting procedure, the seed crystal 100 may have an exposed growth surface that is equal to or less than the area of the front surface 104 (i.e., a portion of the front surface 104 may be covered or otherwise prevented from receiving the incoming vapor). Herein, references to "seed diameter" or "seeded diameter" refer to the diameter of actual area of the seed crystal 100 exposed for growth thereon (i.e., the "seed area" or "seeded area"), even if that area is less than the total area of front surface 104. In addition, the seed diameter or seeded diameter may have a shape different from that of the actual surface 104 of the seed crystal 100 itself, resulting from, e.g., the masking or otherwise occlusion of a portion of surface 104. For example, the seeded diameter may be circular while the actual surface 104 is non-circular or vice versa.

FIG. 1B is a schematic depiction of a crystal (or "crystalline boule" or "boule") 108 resulting from crystal growth on seed crystal 100 (e.g., via a vapor-phase transport technique such as sublimation-recondensation). Note that the crystal 108 does not terminate at a pointed tip, but rather has a relatively planar surface due to the initiation of growth on the seed crystal 100. The crystal 108 has an initial seeded diameter 110 (i.e., the diameter of the seeded area of the crystal, which may correspond to the diameter of the initial seed crystal or a portion thereof) and, due to diameter expansion during growth, may be described as a geometrical combination of a frustum 112 and a dome 114, the frustum 112 resulting from diameter expansion during growth and the dome 114 resulting from, at least in part, the shape of the thermal field within the growth chamber. The frustum 112 may (but need not) be, for example, right, circular, and conical. The dome 114 may (but need not) be, e.g., a spherical cap or a spherical segment. In various embodiments, the dome 114 may have the form of a cone (e.g., with a rounded tip) or a truncated cone (e.g., a frustum tapering in the opposite direction from that of the frustum 112). As shown, the diameter (or other lateral dimension) of the crystal may increase, due to diameter expansion to a maximum crystal diameter 116. The curvature of the dome 114 may increase as the radial thermal gradient utilized during crystal growth increases. As such, crystals 108 having small (or even substantially non-existent) domes 114 may result from the use of small radial thermal gradients during crystal growth. That is, in accordance with embodiments of the invention, the radial thermal gradient may be adjusted (e.g., during growth) to decrease the size of dome 114 or to virtually eliminate dome 114 entirely. Note that, since crystals 108 are grown from seed crystals 100, they are larger, and contain more usable, high-quality volume (e.g., for the production of single-crystal AlN wafers) than similar crystals grown by unseeded growth. (Unseeded growth is typically reliant upon spontaneous nucleation, which can introduce excessive numbers of defects and/or non-uniformity in crystalline orientation.) As disclosed herein, crystals 108, being produced by seeded growth, may also incorporate at least a portion of the seed crystal 100 itself therein.

FIG. 1C is a cross-sectional view of an exemplary crystal 108. As shown, the crystal 108 has a total length 118 that encompasses both the frustum and dome sections of the crystal. The total length 118 includes both an expansion length 120 (i.e., the length of the diameter-expanded volume of the crystal in the growth direction, e.g., perpendicular from the surface of the seed crystal 100) and a dome length 122. In various embodiments of the invention, the crystal 108 may include a portion 124 in which the diameter is not expanded (due to, for example, deliberate modification of the radial thermal gradient and/or diameter expansion sufficient to reach the interior wall of the growth apparatus), and portion 124 may have a length 126 that contributes to total length 118. Portion 124 may be, e.g., cylindrical, or may have one or more flat surfaces (e.g., may have the shape of a hexagonal prism (for example, having sides parallel to the m-planes {1-100})). Portion 124 may be present but is not necessarily present in embodiments of the present invention. When present, portion 124 may have a diameter that is substantially equal to the maximum, or expanded, diameter 116, as shown in FIG. 1C. The frustum 112 also has an expansion height, or slant height, 128, which is measured along the surface of the diameter-expanded volume of the crystal. It is readily apparent from FIG. 1C that, in the absence of diameter expansion, the expansion height 128 and the expansion length are equivalent.

Figure 1D:
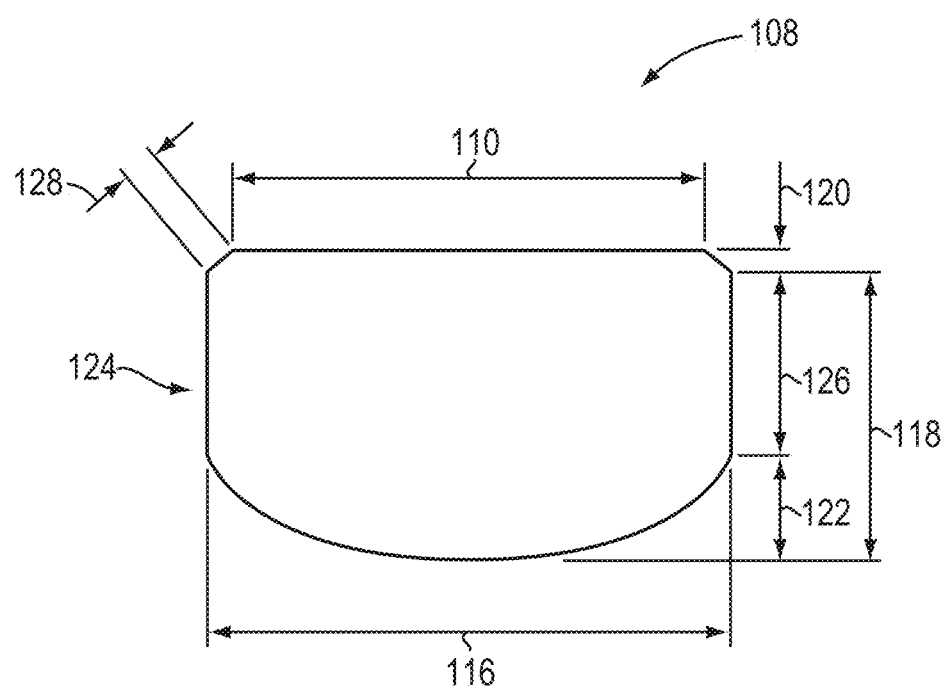

FIG. 1D is a schematic diagram of another exemplary crystal 108 produced in accordance with embodiments of the present invention. As shown, the crystal 108 of FIG. 1D is similar to the crystal 108 of FIG. 1C, except that the "straight" portion 124 having a substantially constant diameter is longer than the expansion length 120, due to rapid initial expansion of the crystal (resulting from, for example, use of one or more of the techniques in accordance with embodiments of the invention detailed herein). Crystals 108 as shown in FIG. 1D may beneficially provide a large crystalline volume from which many wafers having substantially the same diameter may be produced.

In various exemplary embodiments, the expansion length 120 may range from approximately 1%, 2%, 3%, 5%, or 10% to approximately 60%, 65%, 70%, 75%, 80%, 85%, 90%, 95%, or 98% of total length 118, while the length 126 may range from approximately 0%, 0.1%, 0.2%, 0.5%, 1%, 2%, 3%, 5%, or 10% to approximately 60%, 65%, 70%, 75%, 80%, 85%, 90%, 95%, or 98% of total length 118, and the dome length 122 may range from approximately 0%, 0.1%, 0.2%, 0.5%, 1%, 2%, 3%, or 5% to approximately 20%, 25%, 30%, 35%, 40%, or 45% of total length 118 (while, as shown in FIGS. 1C and 1D, the sum of the expansion length 120, length 126, and dome length 122 is equal to 100% of the total length 118).

Figure 1E:
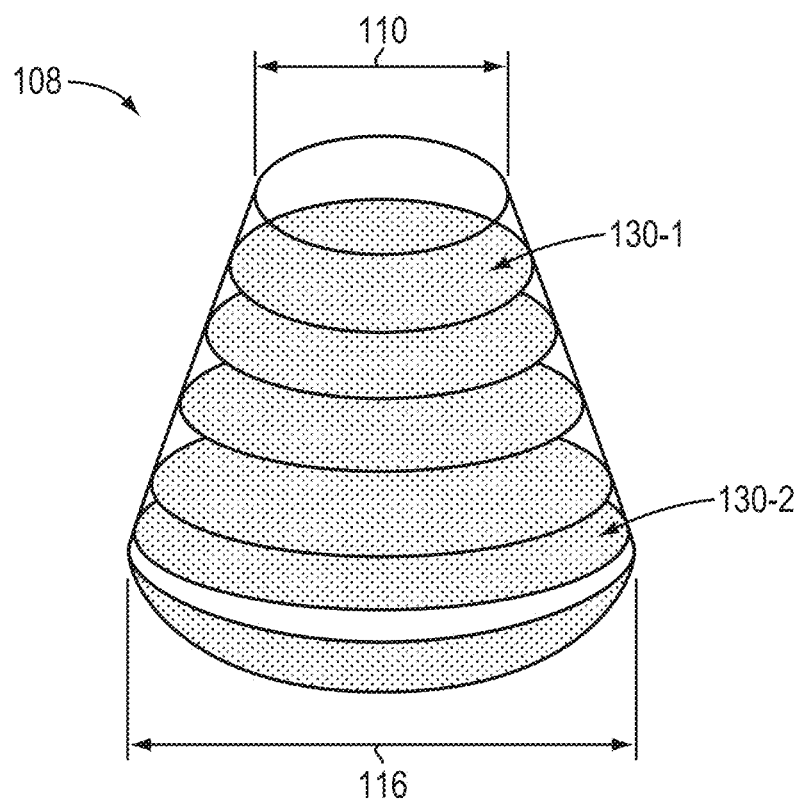
FIGS. 1E and 1F are schematic illustrations of bulk crystals, and associated parameters thereof, in accordance with various embodiments of the invention.
Figure 1F:
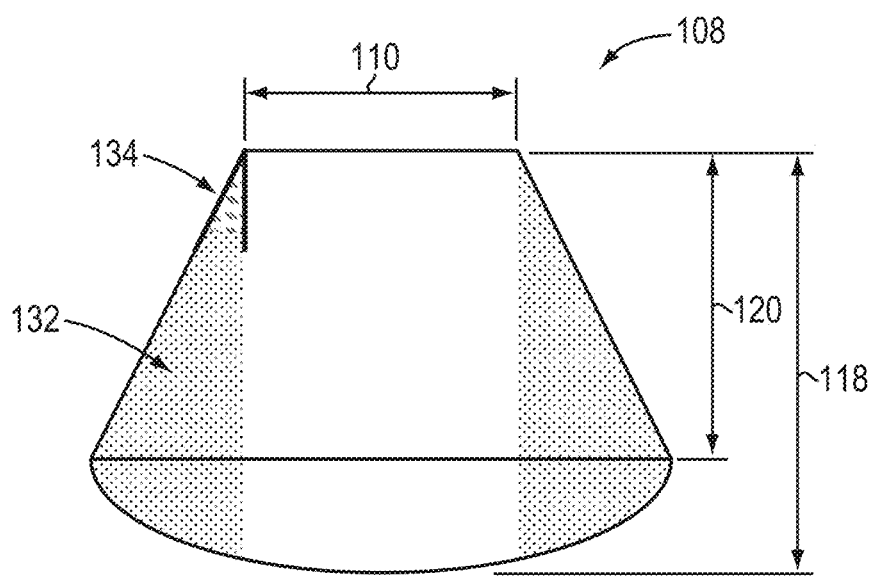

FIGS. 1E and 1F are additional schematic illustrations of various crystals, and associated parameters thereof, relevant to embodiments of the present invention. FIG. 1E schematically depicts how wafers may be sliced from the crystal 108 in accordance with various embodiments of the invention. As shown, a wafer 130-1 and a wafer 130-2 having a larger diameter may be sliced from the crystal 108 substantially parallel to the seed crystal 100. In other embodiments, wafers may be sliced from the crystal 108 along other directions, even substantially perpendicular to the plane of the seed crystal 100. Wafers sliced from crystal 108 having a diameter greater than that of the seed crystal 100 (e.g., wafer 130-2) may be subsequently utilized as seed crystals for additional growth of larger-diameter crystals, for example as disclosed in U.S. patent application Ser. No. 16/008,407, filed on Jun. 14, 2018 (the '407 application), the entire disclosure of which is incorporated by reference herein. Wafers sliced from the portion 124 of a crystal 108 as shown in FIGS. 1C and 1D may have substantially the same diameter as each other.

FIG. 1F is a schematic sectional view of the crystal 108 depicting (in shading) expanded area 132, i.e., the cross-sectional area of the crystal 108 exceeding the seeded area 110 and resulting from diameter expansion. FIG. 1F also depicts an exemplary expansion angle 134, which corresponds to the angle between the normal of the seed crystal and the plane of the expansion height 128. In various embodiments, the expansion angle 134 may be, but is not necessarily, substantially constant during the entire growth of the crystal 108. That is, the plane of the expansion height 128 need not be linear. When wafers are cut from the crystal 108, the expanded area 132 therefore corresponds to an annular region extending inward from the outer edge of the wafer, and the seeded area corresponds to a central area of the wafer having approximately the size and shape of that of the seed crystal 100 utilized to grow the crystal 108. Thus, at least within the frustum 112 of a diameter-expanded crystal 108, a wafer separated from a portion of the boule farther away from the seed crystal 100 will have a larger expanded area 132 than one cut from the boule closer to the seed crystal 100, while the seeded areas of both wafers may be approximately the same in size and shape. On the other hand, multiple wafers separated from a portion 124 of a crystal 108 will have approximately the same expanded areas 132 and approximately the same seeded areas.

The orientation of a wafer or seed crystal may be selected from a boule or other crystal during slicing via, for example, x-ray diffraction measurements and/or other materials characterization enabling identification of the orientation of the crystal; such techniques are known to those of skill in the art and may be performed without undue experimentation. In accordance with embodiments of the invention, a newly sliced wafer or seed may be polished to reduce surface roughness and remove cutting artifacts and/or damage. The polarity of a wafer or seed crystal may also be identified and selected chemically. For example, the polarity may be identified and selected via exposure of the wafer or seed to a basic or acidic solution, which will roughen an N-polarity face while leaving an Al-polarity face smooth, as detailed in the '407 application.

Figure 2:
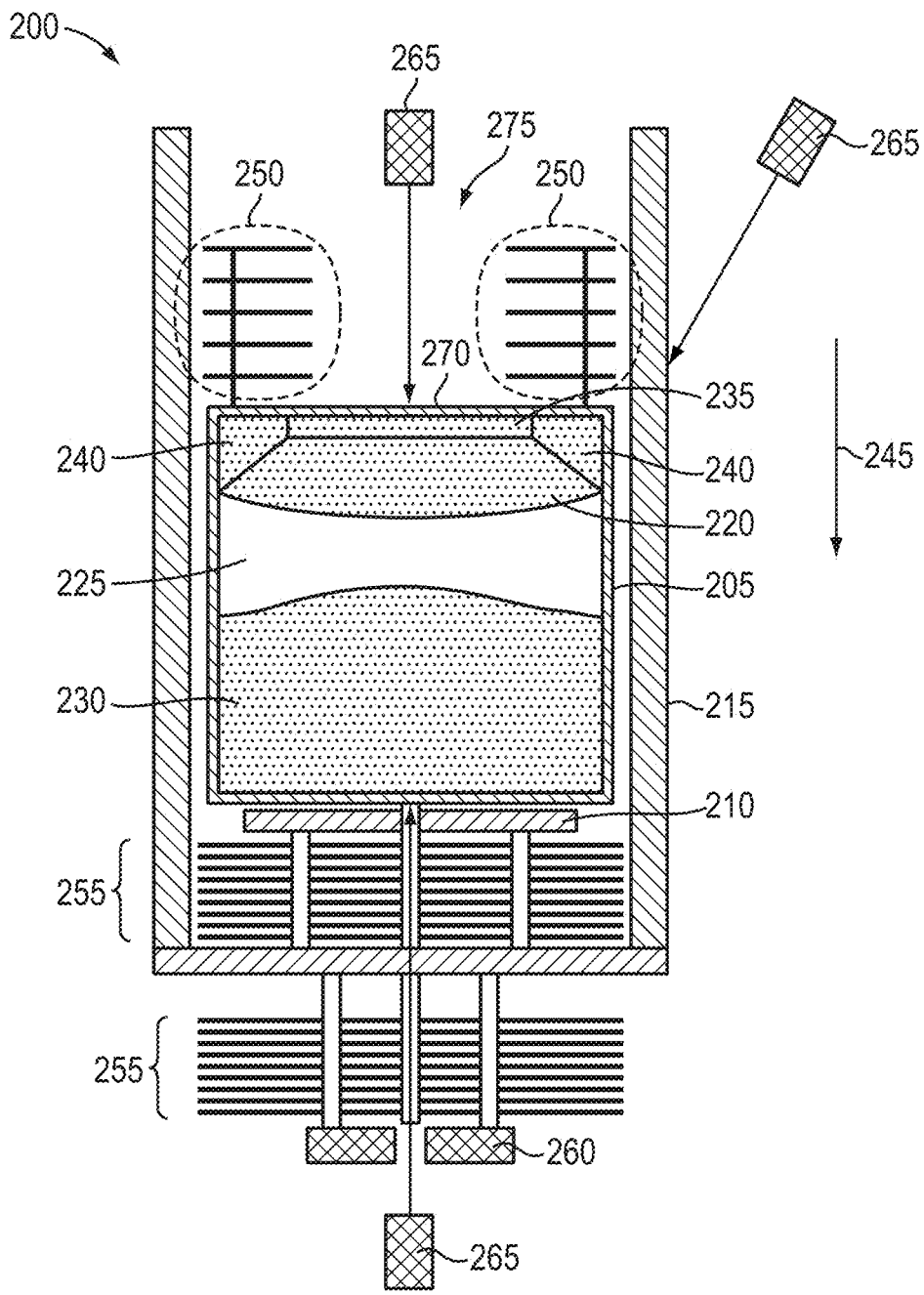
FIG. 2 is a schematic diagram of an apparatus for the growth of single-crystal AlN in accordance with various embodiments of the invention.

FIG. 2 depicts a crystal-growth apparatus 200 suitable for the growth of single-crystal AlN in accordance with various embodiments of the present invention. As shown, apparatus 200 includes a crucible 205 positioned on top of a crucible stand 210 within a susceptor 215. Both the crucible 205 and the susceptor 215 may have any suitable geometric shape, e.g., cylindrical. During a typical growth process, an AlN boule 220 (e.g., a crystal 108) is formed by condensation of a vapor 225 that includes, consists essentially of, or consists of the elemental precursors of the AlN boule 220, i.e., Al and N atoms and/or $N_2$ molecules. In typical embodiments, the vapor 225 arises from the sublimation of a source material 230, which may include, consist essentially of, or consist of the polycrystalline AlN source material described above. The AlN boule 220 may form on and extend from a seed crystal 235. (Alternatively, the AlN boule 220 may nucleate upon and extend from a portion of the crucible 205 itself.) The seed crystal 235 may be a single crystal (e.g., a polished wafer) including, consisting essentially of, or consisting of AlN. In various embodiments, the seed crystal 235 has a diameter (or width or other lateral dimension) of at least approximately 10 mm, at least approximately 25 mm, at least approximately 35 mm, at least approximately 40 mm, or even at least approximately 50 mm. In various embodiments, the seed crystal 235 has a diameter (or width or other lateral dimension) of approximately 50 mm or less, approximately 100 mm or less, or approximately 150 mm or less, and/or single-crystal AlN grown therefrom has a diameter (or width or other lateral dimension) of approximately 150 mm or less. In various embodiments, the crystalline orientation (i.e., the normal to the exposed plane (e.g., c-plane)) of the seed crystal 235 is substantially parallel to the c-axis. In other embodiments, the crystalline orientation of the seed crystal 235 is at least approximately 5°, or even at least approximately 100 away from the c-axis; the orientation of the seed crystal 235 may be toward a non-polar direction. In various embodiments, the crystalline orientation of the seed crystal 235 may be no more than approximately 30°, or no more than approximately 20°, away from the c-axis.

The crucible 205 may include, consist essentially of, or consist of one or more refractory materials, such as tungsten, rhenium, tantalum carbide, and/or tantalum nitride. As described in the '135 patent and the '153 patent, the crucible 205 may have one or more surfaces (e.g., walls) configured to selectively permit the diffusion of nitrogen therethrough and selectively prevent the diffusion of aluminum therethrough.

As shown in FIG. 2, during formation of the AlN boule 220, a polycrystalline material 240 may (but does not necessarily) form at one or more locations within the crucible 205 not covered by the seed crystal 235. However, the diameter (or other radial dimension) of the AlN boule 220 may expand, i.e., increase, during formation of the AlN boule 220, thereby occluding the regions of polycrystalline material 240 (if present) from impinging vapor 225 and substantially limiting or even eliminating their growth. As shown in FIG. 2, the diameter of the AlN boule 220 may expand to (or even start out at, in embodiments utilizing larger seed crystals 235) be substantially equal to the inner diameter of the crucible 205 (in which case no further lateral expansion of the AlN boule 220 may occur).

The growth of the AlN boule 220 along a growth direction 245 typically proceeds due to a relatively large axial thermal gradient (e.g., ranging from approximately 5° C./cm to approximately 100° C./cm) formed within the crucible 205. A heating apparatus (not shown in FIG. 2 for clarity), e.g., an RF heater, one or more heating coils, and/or other heating elements or furnaces, heats the susceptor 215 (and hence the crucible 205) to an elevated temperature typically ranging between approximately 1800° C. and approximately 2300° C. Prior to the onset of growth, the crucible 205 and its contents (e.g., seed crystal 235 and source material 230) may be held at a temperature approximately equal to the desired growth temperature for a predetermined soak time (e.g., between approximately 1 hour and approximately 10 hours). In various embodiments, this soak at temperature stabilizes the thermal field within the crucible 205, promotes effective nucleation on the seed crystal 235, and promotes high-quality transition from nucleation to bulk growth of the single-crystalline AlN.

The apparatus 200 may feature one or more sets of top thermal shields 250, and/or one or more sets of bottom axial thermal shields 255, arranged to create the large axial thermal gradient (by, e.g., better insulating the bottom end of crucible 205 and the source material 230 from heat loss than the top end of crucible 205 and the growing AlN boule 220). During the growth process, the susceptor 215 (and hence the crucible 205) may be translated within the heating zone created by the heating apparatus via a drive mechanism 260 in order to maintain the axial thermal gradient near the surface of the growing AlN boule 220. One or more pyrometers 265 (or other characterization devices and/or sensors) may be utilized to monitor the temperature at one or more locations within susceptor 215. The top thermal shields 250 and/or the bottom thermal shields 255 may include, consist essentially of, or consist of one or more refractory materials (e.g., tungsten), and may be quite thin (e.g., between approximately 0.125 mm and 0.5 mm thick). As detailed in the '612 patent, the top thermal shields 250 and/or the bottom thermal shields 255 may be arranged in various configurations and/or have various characteristics (i.e., different numbers of shields, different spacings between shields, different thicknesses, different sized apertures defined therethrough, different sizes, etc.) in order to form a variety of different axial and radial thermal gradients within the crucible 205 and thus, the growth of the AlN boule 220 (e.g., the growth rate, the degree of radial expansion during growth, if any, etc.).

In various embodiments, the crucible 205 has a lid 270 with sufficient radiation transparency to enable at least partial control of the thermal profile within the crucible 205 via the arrangement of the top thermal shields 250. Furthermore, in embodiments featuring a seed crystal 235, the seed crystal 235 is typically mounted on the lid 270 prior to the growth of AlN boule 220. The lid 270 is typically mechanically stable at the growth temperature (e.g., up to approximately 2300° C.) and may substantially prevent diffusion of Al-containing vapor therethrough. Lid 270 generally includes, consists essentially of, or consists of one or more refractory materials (e.g., tungsten, rhenium, and/or tantalum nitride), and may be fairly thin (e.g., less than approximately 0.5 mm thick).

As shown in FIG. 2, each of the top thermal shields may have an opening 275 therethrough. The opening 275 normally echoes the geometry and/or symmetry of the crucible 205 (e.g., the opening 275 may be substantially circular for a cylindrical crucible 205). The size of each opening 275 may be varied; typically, the size(s) range from a minimum of 10 mm to a maximum of approximately 5 mm (or even 2 mm) less than the diameter of the crucible 205.

For example, in an embodiment, five thermal shields 250, each having a diameter of 68.5 mm and an opening size (diameter) of 45 mm, are used. The thickness of each of the thermal shields 250 is 0.125 mm, and the thermal shields 250 are spaced approximately 7 mm from each other. At a typical growth temperature of 2065° C., this shield arrangement results in a radial thermal gradient (measured from the center of the semiconductor crystal to the inner edge of the crucible) of 27° C./cm. Of course, this value is merely exemplary, and those of skill in the art may arrange thermal shields to achieve a range of different radial thermal gradients without undue experimentation.

Embodiments of the present invention enable even higher rates of diameter expansion of the AlN crystal via augmentation of the radial thermal gradient resulting from the arrangement of thermal shields 250. (For avoidance of doubt, the techniques detailed herein in accordance with embodiments of the invention enable higher rates of diameter expansion of growing AlN single crystals, while preserving crystal quality (and therefore, the production of AlN single crystals having larger crystal augmentation parameters, as detailed herein), than do techniques detailed in the '612 patent.) In general, techniques in accordance with embodiments of the invention increase the radial thermal gradient via tailored heating of the edges of the growing crystal and/or altering the condensing vapor to enhance lateral growth of the crystal. In conventional techniques, often the conventional wisdom is the suppression of the radial thermal gradient in order to, e.g., minimize the curvature of the leading edge of the growing crystal. The conventional wisdom in the art also tends to emphasize the maintenance of a substantially uniform temperature in the radial direction during crystal growth. Embodiments of the invention contradict such conventional wisdom in order to further enhance diameter expansion (for example, beyond that achievable merely by the arrangement of external thermal shields, even in combination with external differential heating and insulation techniques) while maintaining high crystalline quality of the resulting bulk crystal.

Figure 3:
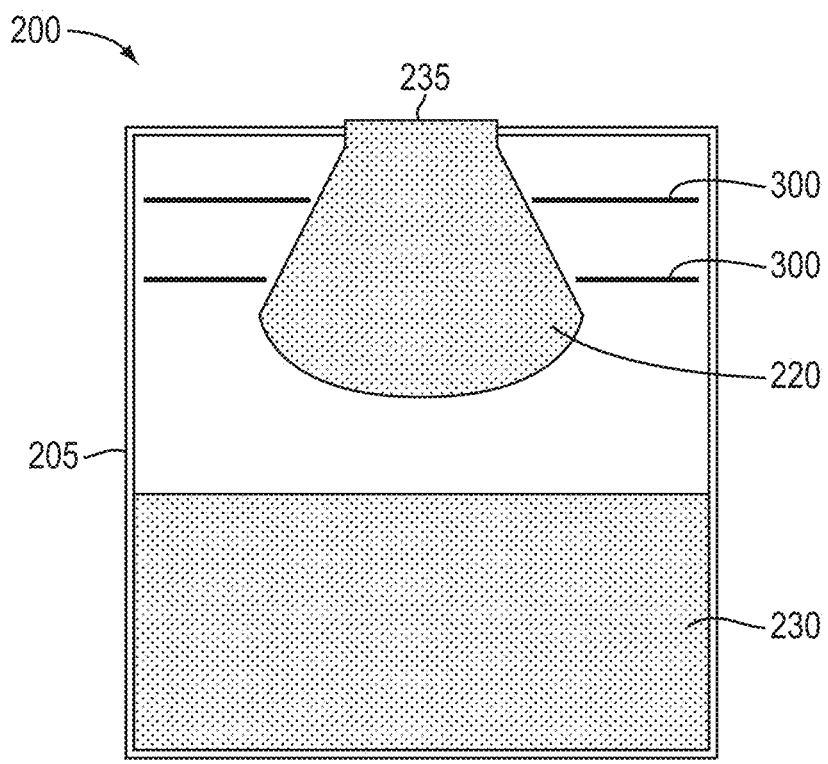
FIG. 3 is a schematic diagram depicting portions of an apparatus for the growth of single-crystal AlN in accordance with various embodiments of the invention.

FIG. 3 illustrates one technique for enhancing the radial thermal gradient in accordance with embodiments of the invention. In the embodiment of FIG. 3, one or more internal shields (or baffles) 300 are disposed within the crucible 205 proximate the edge of the growing AlN boule 220. In accordance with various embodiments, the internal shields 300 transfer heat from the walls of the crucible 205 toward the edge of AlN boule 220, raising the temperature thereof, and the internal shields 300 also retain the heat in proximity to the edge of the AlN boule 220. In this manner, the internal shields 300 augment, or increase, the radial thermal gradient within the crucible 205, resulting in enhanced lateral crystal growth and increased diameter expansion of AlN boule 220. In various embodiments of the invention, the number of internal shields 300 disposed within the crucible 205 ranges from 1 to 10, or even 1 to 15. The present inventors have found that the use of internal shields 300 within the crucible 205 enables more rapid diameter expansion of the AlN boule 220 and, relatedly, the formation of larger boules, with more usable volume for the fabrication of substrates therefrom, than is possible with conventional growth techniques, despite the conventional wisdom that additional objects disposed within the growth crucible tend to deleteriously disrupt crystal growth and/or act as nucleation centers for extraneous, parasitic growth of polycrystalline or otherwise unusable material.

In various embodiments of the invention, the internal shields 300 include, consist essentially of, or consist of one or more refractory materials (e.g., tungsten and/or TaC), and may be quite thin (e.g., between approximately 0.125 mm and 0.5 mm thick). In other embodiments, one or more of the thermal shields may have a greater thickness, e.g., ranging from approximately 1 mm to approximately 3 mm. In various embodiments, the density (and concomitant impact on the thermal field proximate the shield) of one or more of the internal shields 300 may vary. For example, one or more of the internal shields 300 may have a density ranging from approximately 10% full density to approximately 100% full density (as an example, the 100% full density of tungsten is approximately 19.3 g/cm$^3$). Thin foils of refractory materials having different densities and/or thicknesses are commercially available and may be provided without undue experimentation. In various embodiments, an internal shield having a larger thickness and/or a larger density may transfer more heat, and therefore increase the radial thermal gradient, more than such shields having smaller thicknesses and/or smaller densities.

As shown in FIG. 3, the outer boundary of the internal shields 300 may conform substantially to the shape and size of the interior wall of the crucible 205, and the size of the central openings in the internal shields 300 may vary to accommodate diameter expansion (e.g., expected diameter expansion) of the AlN boule 220. For example, the central openings of the internal shields 300 may increase as the distance of the individual shields away from the seed crystal 235 increases, at least when the internal shields 300 are positioned where it is desired or expected for the AlN boule 220 to undergo diameter expansion. In addition, the density and/or thickness of the individual internal shields 300 may vary (e.g., increase) as a function of distance away from the seed crystal 235, at least when the internal shields 300 are positioned where it is desired or expected for the AlN boule 220 to undergo diameter expansion. Such increases may compensate for the loss of volume of the shields 300 having larger central openings. In various embodiments, at positions where it is desired or expected for the AlN boule 220 to not undergo diameter expansion, the central opening size, density, and/or thickness of the internal shields 300 may be substantially constant.

Similarly, in regions in which more rapid diameter expansion is desired, the spacing between the internal shields 300 may be decreased, compared to regions in which diameter expansion is not desired or expected (e.g., to as large a degree). Example spacings between the internal shields 300 may range from approximately 1 mm to approximately 50 mm, or from approximately 5 mm to approximately 10 mm.

In accordance with embodiments of the invention, the internal shields 300 may be mounted within the crucible 205 via a variety of different approaches. For example, the internal shields 300 may be held by or affixed to the interior surface of the crucible 205 at their outer edges. The internal shields 300 may each be rested on a platform or pedestal within the crucible 205 (e.g., extending from the inner wall thereof), or the internal shields 300 may rest at their central openings on an internal support extending from the top surface of the crucible proximate the seed crystal 235. (The internal support is not depicted in FIG. 3 for clarity, but may echo the outer shape of the crystal and either be in contact therewith or spaced away therefrom; the inner edges of the internal shields 300 may contact the internal support and therefore be supported thereby.) The internal support, which may include, consist essentially of, or consist of one or more of the same materials as internal shields 300, may have the shape of a truncated cone having a first inner diameter at its upper end (i.e., the end proximate the seed crystal 235) approximately equal to, or even less than the diameter of seed crystal 235, and a second, larger, inner diameter at its lower end. In various embodiments, the inner diameter of the internal support may increase at a rate substantially equal to or greater than the (e.g., desired or expected) expansion rate and/or angle of the AlN boule 220. That is, in embodiments of the invention, the AlN boule 220 may not contact (at least, not fully contact except at one or more discrete points) the interior surface of the internal support (i.e., the internal support may not contact and fit snugly around the AlN boule 220). In other embodiments, the inner diameter of the internal support may increase at a rate smaller than the expected expansion angle of the AlN boule 220 (i.e., the expansion angle that would otherwise occur given the growth parameters in the absence of the internal support), and thus the internal support may restrict the expansion angle and rate of expansion of the AlN boule 220 to desired values defined by the geometry of the support.

In various embodiments, all or a portion of the internal support may be conical (i.e., have a diameter that increases in a direction away from the seed crystal 235), e.g., at positions where it is desired or expected for the AlN boule 220 to undergo diameter expansion. For example, all or a portion of the internal support may have the shape of a frustum having a smaller-diameter top opening to accommodate the seed crystal 235, and which flares out to accommodate the diameter-expanded AlN boule 220. In various embodiments, all or a portion of the internal support may be cylindrical (i.e., have a diameter than is substantially constant as a function of distance away from the seed crystal 235), e.g., at positions where it is desired or expected for the AlN boule 220 to not undergo diameter expansion. In one example, the internal support may be partially conical and partially cylindrical, echoing the diameter change of portions 112 and 124 of the crystal 108 shown in FIG. 1C.

In FIG. 3, the interior shields 300 are depicted as extending around the AlN boule 220 approximately parallel to the plane of the seed crystal 235 (i.e., approximately perpendicular to the lateral growth direction) and/or to the top or bottom surface of the crucible 205, but in various embodiments the internal shields 300 are oriented at other angles. For example, one or more of the interior shields 300 may extend approximately perpendicular to the plane of the seed crystal 235 or at an inclined angle thereto (e.g., at an angle ranging from approximately 5° to approximately 85° with respect to the plane of the seed crystal and/or to the top and/or bottom surface of the crucible). In an example embodiment, one or more of the interior shields 300 may be oriented at an angle approximately perpendicular to the plane defined by the expansion height of the AlN boule 220 (i.e., approximately perpendicular to the edge of the frustum of the crystal)—for example, one or more of the internal shields 300 may extend approximately perpendicular from the inclined edge of the internal support. In various embodiments, one or more of the interior shields 300 may be oriented at angles different from those at while one or more of the other interior shields 300 are oriented. In various embodiments, the interior shields 300 merely influence the thermal field within the crucible 205 (e.g., increase the radial thermal gradient at one or more points and/or regions) and do not contact the AlN boule 220 itself during growth thereof.

Figure 4:
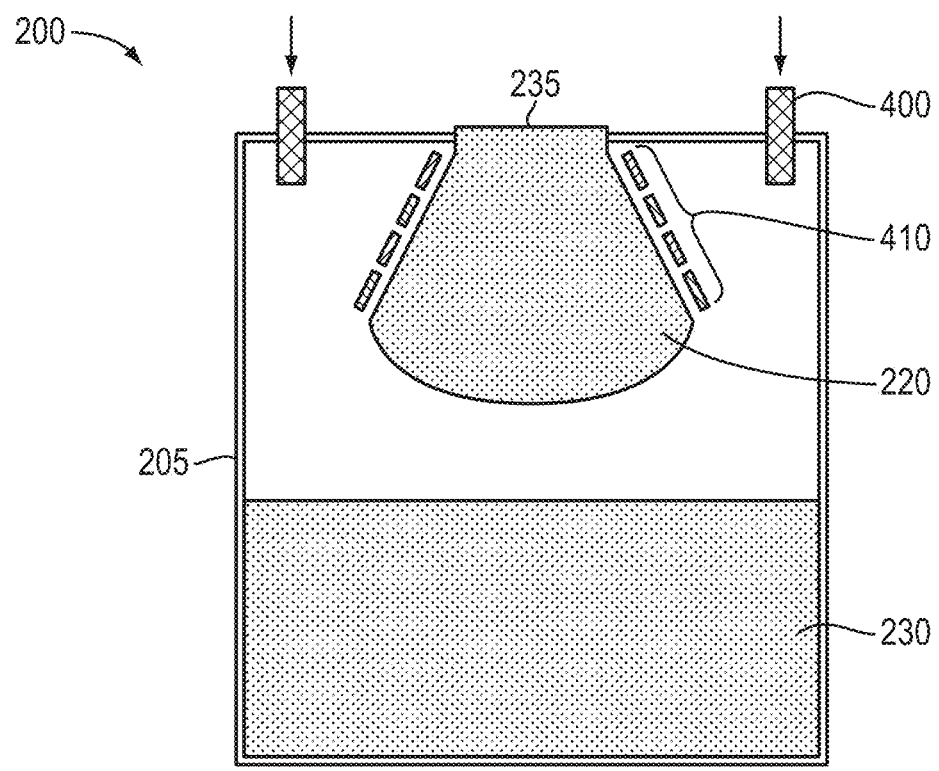
FIG. 4 is a schematic diagram depicting portions of an apparatus for the growth of single-crystal AlN in accordance with various embodiments of the invention.

In various embodiments of the invention, atmospheric plasma is utilized to enrich the source vapor phase within the crucible 205 with nitrogen atoms and concentrate such atoms preferentially at the lateral edge of the growing crystal. The excess nitrogen produced by the plasma process promotes increased lateral growth of the AlN crystal at rates exceeding those enabled by the mere introduction of nitrogen gas (or a nitrogen-containing gas) itself, even at super-atmospheric growth pressures. As shown in FIG. 4, nitrogen gas (and/or a nitrogen-containing gas) may be introduced into the crucible 205 via one or more nozzles 400 in order to provide excess nitrogen proximate the edge of the growing AlN boule 220. In addition, one or more plasma electrodes 410 are disposed proximate to (e.g., at a distance ranging from approximately 0.3 cm to approximately 1 cm away from) the edge of the AlN boule 220 (e.g., where the edge is expected to reach or be during growth) and/or to the internal support (if present). As shown, the electrodes 410 may be arranged at an angle to accommodate diameter expansion of the AlN boule 220, but in other embodiments the electrodes 410 may be arranged in other configurations (e.g., parallel to the crucible walls or at an angle and then parallel to the crucible walls). AC or DC current may be applied to the electrodes 410 via a high-frequency current source (which may be incorporated with the RF source utilized for crystal growth), and a pulsed electric arc may be generated via high-voltage discharge at the electrodes 410. The nitrogen gas from nozzles 400 may flow proximate or through the electrodes 410 and be converted into a plasma that envelops all or a portion of the edge of the AlN boule 220. This nitrogen plasma significantly and preferentially increases the amount of nitrogen within the expanded portion of the AlN boule 220, increasing its lateral growth rate (and therefore enhancing the diameter expansion of AlN boule 220).

In various embodiments, the electrodes 410 may be operated, and the resulting plasma formed, uniformly during most of significantly all of the growth of the AlN boule 220. In other embodiments, the electrodes 410 may be operated only during one, two, or more intervals during the growth, and the plasma may not be present between such intervals. In yet other embodiments, the current applied to the electrodes 410 may be varied one or more times during the growth to increase or decrease the amount of plasma produced during particular points of the growth process. In this manner, the rate of diameter expansion of AlN boule 220, and the resulting shape thereof, may be influenced by the presence or absence of the plasma, and/or of the level of power supplied to the electrodes 410.

Embodiments of the present invention enable the growth of AlN single crystals having masses, volumes, and/or rates of diameter expansion greater than those enabled by conventional techniques. For example, embodiments of the invention enable the formation of AlN single crystals having large crystal augmentation parameters (CAPs), where the CAP, in mm, is defined as:

$$CAP = \frac{A_E - A_S}{L_E} = \frac{\pi}{4 \times L_E}(d_E^2 - d_S^2)$$

where $A_E$ is the expanded area (i.e., the cross-sectional area of the portion of the crystal having the maximum diameter 116 in FIGS. 1B and 1C) in mm², $d_E$ is the expansion diameter (i.e., the maximum diameter 116 in FIGS. 1B and 1C) in mm, $A_S$ is the seeded area (i.e., the cross-sectional area of the portion of the crystal having the seeded diameter 110 in FIGS. 1B and 1C) in mm², $d_S$ is the seed diameter (i.e., the seed diameter 110 in FIGS. 1B and 1C, which may correspond to the minimum diameter of the crystal) in mm, and $L_E$ is the expansion length (i.e., length 120 in FIGS. 1C and 1F) of the crystal in mm. In accordance with embodiments of the invention, the CAP value provides a superior measure of diameter expansion, normalized to crystal length, than the expansion angle 134 (see FIG. 1F), as the expansion angle may vary during growth of the crystal and/or may be difficult to measure.

Figure 5:
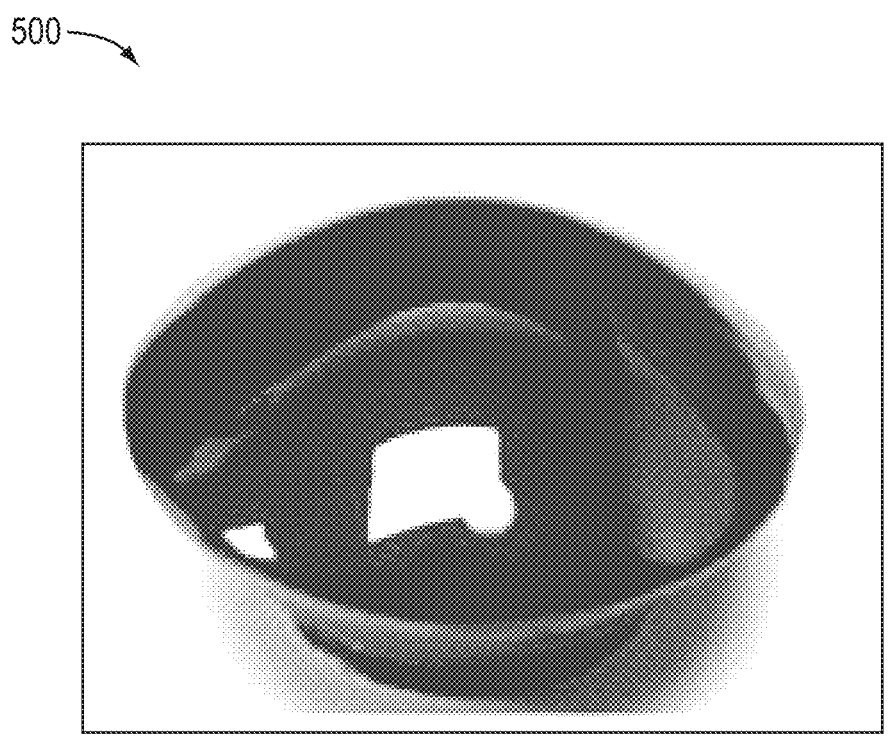
FIG. 5 is a picture of an exemplary AlN single-crystal boule produced in accordance with various embodiments of the invention.

Embodiments of the present invention enable the growth of AlN single crystals having CAPs unattainable utilizing conventional techniques, due at least in part to faster diameter expansion during crystal growth. Embodiments of the invention also maintain high crystal quality, notwithstanding the faster diameter expansion during crystal growth. FIG. 5 is a photograph of an exemplary AlN single crystal 500 grown in accordance with embodiments of the invention. AlN single crystals in accordance with embodiments of the invention may have CAP values greater than 20, greater than 40, greater than 60, greater than 80, greater than 90, greater than 100, greater than 150, greater than 500, greater than 1000, or even greater than 1500 (herein, all CAP values are in units of mm unless otherwise indicated), while AlN crystals produced by conventional techniques and AlN crystals reported in the literature have computed CAP values less than 20 (e.g., between 10 and 15, or even less). Conventional growth techniques incapable of fast diameter expansion require much longer growths (and concomitantly larger expansion lengths and smaller CAPs) to achieve large expanded areas of the resulting AlN single crystals. Thus, embodiments of the invention facilitate the faster, more economical production of large, high-quality AlN crystals (e.g., single-crystal AlN wafers) from small seed crystals. For example, the crystal 500 of FIG. 5 has a CAP of 45, thereby illustrating the superiority of embodiments of the present invention over conventional techniques. In accordance with various embodiments, the CAP of AlN single crystals may be no greater than approximately 1600, or no greater than approximately 1700, or no greater than approximately 2000.

Table 1 below reports various CAP values for a variety of different crystals produced by the present inventors, as well as the ratios (in %) of various dimensional parameters for the crystals as shown in FIGS. 1B-1D. In Table 1, crystals #1-#4 and #10-#15 had the shape of crystal 108 depicted in FIG. 1B (i.e., with no "straight" portion 124), while crystal #5 had the shape of crystal 108 depicted in FIG. 1C (i.e., with a longer frustum 112 and corresponding expansion length) and crystals #6-#9 had the shape of crystal 108 depicted in FIG. 1D (i.e., with a short expansion length and longer straight portion 124).

TABLE 1

| | | Ratios, % | | | |
|---|---|---|---|---|---|
| Crystal # | CAP (mm) | Boule Length/ Expanded Diameter (118/116) | Expansion Length/ Total Length (120/118) | Straight Height/ Total Length (126/118) | Expansion Length/ Expanded Diameter (120/116) |
| 1 | 80 | 33 | 44 | 0 | 14.55 |
| 2 | 92 | 35 | 64 | 0 | 22.58 |
| 3 | 99 | 44 | 54 | 0 | 23.44 |
| 4 | 132 | 54 | 34 | 0 | 18.46 |
| 5 | 75 | 42 | 19 | 37 | 8.08 |
| 6 | 1,570 | 38 | 1 | 18 | 0.38 |
| 7 | 1,059 | 52 | 2 | 61 | 0.93 |
| 8 | 777 | 48 | 2 | 49 | 0.96 |
| 9 | 314 | 54 | 4 | 73 | 1.92 |
| 10 | 122 | 35 | 50 | 0 | 17.65 |
| 11 | 91 | 47 | 50 | 0 | 23.53 |
| 12 | 110 | 27 | 50 | 0 | 13.64 |
| 13 | 138 | 42 | 50 | 0 | 20.83 |
| 14 | 28 | 66 | 72 | 0 | 47.87 |
| 15 | 110 | 44 | 42 | 0 | 18.51 |

Embodiments of the invention also enable the fabrication of AlN single crystals having unusually large masses and/or volumes compared to conventional AlN crystals. For example, AlN single-crystal boules grown in accordance with embodiments of the present invention may have a mass greater than approximately 78 g, greater than approximately 100 g, greater than approximately 120 g, or greater than approximately 140 g, greater than approximately 220 g, or even greater than approximately 240 g. In accordance with various embodiments, the mass may be less than approximately 350 g, or less than approximately 300 g. When larger seeds are utilized, AlN single-crystal boules grown in accordance with embodiments of the present invention may have even larger masses, e.g., greater than approximately 300 g, greater than approximately 500 g, greater than approximately 800 g, greater than approximately 1000 g, or even greater than approximately 1200 g. In accordance with various embodiments, the mass may be less than approximately 1500 g, or less than approximately 1400 g. Thus, exemplary ranges of boule mass in accordance with embodiments of the present invention include, but are not limited to, approximately 78 g-approximately 1300 g, approximately 78 g-approximately 300 g, and approximately 380 g-approximately 1300 g.

Correspondingly (and assuming a constant boule density of 3.255 g/cm³ for AlN), AlN single-crystal boules grown in accordance with embodiments of the present invention may have a volume greater than approximately 24 cm³, greater than approximately 30 cm³, greater than approximately 50 cm³, greater than approximately 70 cm³, greater than approximately 75 cm³, or greater than approximately 80 cm³. In accordance with various embodiments, the volume may be less than approximately 100 cm³, or less than approximately 90 cm³. When larger seeds are utilized, AlN single-crystal boules grown in accordance with embodiments of the present invention may have even larger volumes, e.g., greater than approximately 100 cm³, greater than approximately 200 cm³, greater than approximately 300 cm³, or even greater than approximately 350 cm³. In accordance with various embodiments, the volume may be less than approximately 500 cm³, or less than approximately 400 cm³. Thus, exemplary ranges of boule volume in accordance with embodiments of the present invention include, but are not limited to, approximately 24 cm³-approximately 400 cm³, approximately 24 cm³-approximately 80 cm³, and approximately 120 cm³-approximately 400 cm³.

Figure 6A:
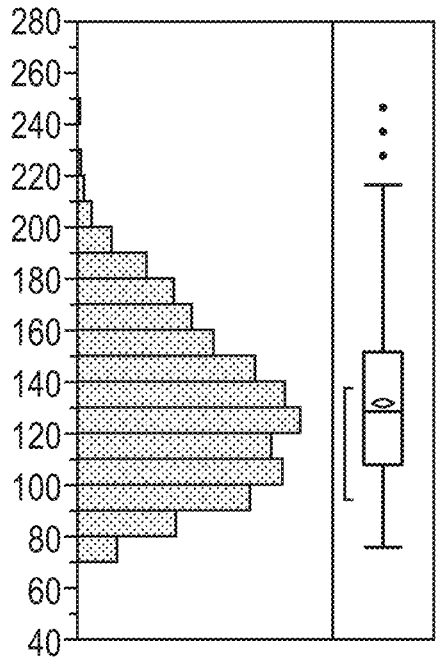
FIGS. 6A and 6B are graphs of distribution of boule mass and volume, respectively, of AlN single-crystal boules produced in accordance with various embodiments of the invention.
Figure 6B:
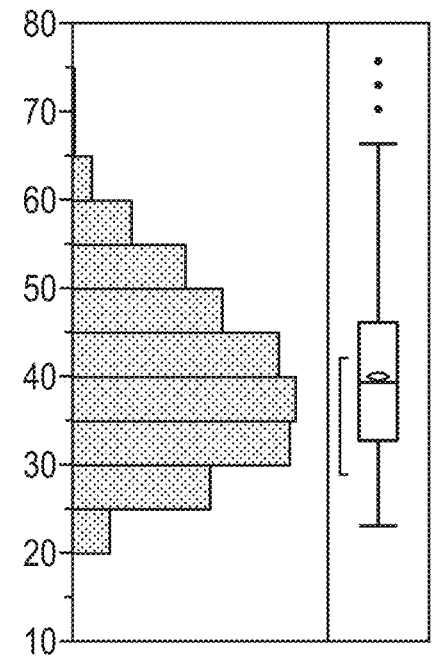

FIG. 6A is a plot showing the distribution of mass (and standard deviation thereof) of over 1200 different AlN single-crystal boules grown in accordance with embodiments of the present invention with seed crystals having diameters of approximately 52 mm or less. Using such seed crystals, as shown, the mass of the boules ranges from approximately 70 g to over approximately 250 g. FIG. 6B is a plot showing the distribution (and standard deviation) of the calculated boule volumes of the over 1200 different AlN single-crystal boules. Such volumes, in these example embodiments, range from approximately 20 cm³ to approximately 80 cm³. As demonstrated, AlN single-crystal boules grown in accordance with embodiments of the present invention have larger mass and/or volume than those produced using conventional techniques. The values reported in FIGS. 6A and 6B scale up accordingly when larger seed crystals are utilized for growth in accordance with embodiments of the present invention, and thus the values reported in FIGS. 6A and 6B should not be interpreted as limiting embodiments of the present invention. The present inventors have achieved boules having larger masses and volumes, as detailed above, using larger seed crystals.

In various embodiments (and as demonstrated by, e.g., Table 1 above), AlN single-crystal boules grown in accordance with embodiments of the invention have ratios of boule length (i.e., total length 118 in FIGS. 1C and 1F) to maximum diameter (i.e., maximum crystal diameter 116 in FIGS. 1B and 1C) ranging from approximately 0.3 to approximately 0.7, or ranging from approximately 0.35 to approximately 0.66. In various embodiments AlN single-crystal boules grown in accordance with embodiments of the invention have ratios of expansion length (i.e., expansion length 120 in FIGS. 1C and 1F) to maximum diameter (i.e., maximum crystal diameter 116 in FIGS. 1B and 1C) falling into one of two different ranges, depending upon the rapidity of the diameter expansion. For example, AlN single-crystal boules grown in accordance with embodiments of the invention having small expansion lengths (e.g., as shown in FIG. 1D; for example, boules having ratios of expansion length to total length ranging from approximately 0.5% to approximately 5%, or approximately 1% to approximately 4%) may have ratios of expansion length to maximum diameter ranging from approximately 0.002 to approximately 0.02, or from approximately 0.003 to approximately 0.02, or from approximately 0.003 to approximately 0.01. In another example, AlN single-crystal boules grown in accordance with embodiments of the invention having larger expansion lengths (e.g., as shown in FIGS. 1B and 1C; for example, boules having ratios of expansion length to total length ranging from approximately 15% to approximately 80%, or from approximately 30% to approximately 70%) may have ratios of expansion length to maximum diameter ranging from approximately 0.08 to approximately 0.5, or from approximately 0.1 to approximately 0.3, or from approximately 0.15 to approximately 0.25.

The values of both ratios are lower than those previously achieved in the art and demonstrate the superiority of AlN single-crystal boules grown in accordance with embodiments of the present invention compared to those produced using conventional techniques. For example, boules in accordance with embodiments of the present invention enable the fabrication of greater numbers of large-diameter AlN single-crystal wafers per total boule length, i.e., the single-crystal AlN is more beneficially distributed within the boule, at least from the standpoint of large wafer production.

The crystals produced in accordance with embodiments of the invention are therefore more economical, and enable production of larger wafers therefrom, when compared to conventional crystals and production techniques therefor.

In accordance with embodiments of the invention, the seed diameter may range from approximately 5 mm to approximately 100 mm, approximately 5 mm to approximately 52 mm, or approximately 52 mm to approximately 100 mm. The total boule length may range from approximately 18 mm to approximately 50 mm, approximately 18 mm to approximately 35 mm, or approximately 30 mm to approximately 50 mm. The maximum crystal diameter may range from approximately 17 mm to approximately 120 mm, approximately 17 mm to approximately 65 mm, or approximately 65 mm to approximately 120 mm. These values are exemplary and should not be interpreted as limiting embodiments of the present invention.

Moreover, single-crystal AlN boules fabricated in accordance with embodiments of the invention exhibit high crystal quality, notwithstanding the high rates of diameter expansion utilized during their formation. For example, boules fabricated in accordance with embodiments of the invention exhibit threading dislocation densities less than $10^5$ cm$^{-2}$, or even less than $3\times10^4$ cm$^{-2}$, as confirmed by x-ray topography measurements. Moreover, such low defect densities are approximately the same in peripheral, expanded regions of the boules and the central portions of the boules.

One or more substrates (or "wafers") may be separated from AlN boule 220 by the use of, e.g., a diamond annular saw or a wire saw, after crystal growth. In an embodiment, a crystalline orientation of a substrate thus formed may be within approximately 2° (or even within approximately 1°, or within approximately 0.5°) of the (0001) face (i.e., the c-face). Such c-face wafers may have an Al-polarity surface or an N-polarity surface, and may subsequently be prepared as described in U.S. Pat. No. 7,037,838, the entire disclosure of which is hereby incorporated by reference. In other embodiments, the substrate may be oriented within approximately 2° of an m-face or a-face orientation (thus having a non-polar orientation) or may have a semi-polar orientation if AlN boule 220 is cut along a different direction. The surfaces of these wafers may also be prepared as described in U.S. Pat. No. 7,037,838. The substrate may have a roughly circular cross-sectional area with a diameter of greater than approximately 50 mm. The substrate may have a thickness that is greater than approximately 100 µm, greater than approximately 200 µm, or even greater than approximately 2 mm. The substrate typically has the properties of AlN boule 220, as described herein. After the substrate has been cut from the AlN boule 220, one or more epitaxial semiconductor layers and/or one or more light-emitting devices, e.g., UV-emitting light-emitting diodes or lasers, may be fabricated over the substrate, for example as described in U.S. Pat. Nos. 8,080,833 and 9,437,430, the entire disclosure of each of which is hereby incorporated by reference.

AlN bulk crystals (e.g., boules and/or wafers) produced in accordance with embodiments of the present invention may have etch pit density measurements (i.e., etching measurements that reveal defects such as threading dislocations intersecting the surface of the crystal) ranging from approximately $5\times10^3$ cm$^{-2}$ to approximately $1\times10^4$ cm$^{-2}$. AlN crystals in accordance with embodiments of the present invention may have a density of threading edge dislocations ranging from approximately $1\times10^3$ cm$^{-2}$ to approximately $1\times10^4$ cm$^{-2}$ and a density of threading screw dislocations ranging from approximately 1 cm$^{-2}$ to approximately 10 cm$^{-2}$, e.g., a total threading dislocation density less than approximately $10^4$ cm$^{-2}$. When measured via x-ray diffraction, x-ray rocking curves (e.g., along (0002) and/or (10-12)) of AlN crystals in accordance with embodiments of the invention may have full width at half maximum (FWHM) values less than 50 arcsec (e.g., ranging from approximately 30 arcsec to approximately 50 arcsec, or from approximately 40 arcsec to approximately 50 arcsec), or even less than 40 arcsec (e.g., ranging from approximately 20 arcsec to approximately 40 arcsec, approximately 30 arcsec to approximately 40 arcsec, or approximately 20 arcsec to approximately 35 arcsec). As measured by secondary ion mass spectroscopy (SIMS), AlN single crystals in accordance with embodiments of the invention may have carbon concentrations of approximately $1.8\times10^{16}$ cm$^{-3}$-$5\times10^{17}$ cm$^{-3}$, as well as oxygen concentrations of approximately $1\times10^{17}$ cm$^{-3}$-$7.9\times10^{17}$ cm$^{-3}$. In various embodiments, the carbon concentration may range from approximately $1.8\times10^{16}$ cm$^{-3}$ to approximately $5\times10^{16}$ cm$^{-3}$. The thermal conductivity of AlN single crystals in accordance with embodiments of the invention may be greater than approximately 290 Watts per meter-Kelvin (W/m·K), as measured by the American Society for Testing and Materials (ASTM) Standard E1461-13 (Standard Test Method for Thermal Diffusivity by the Flash Method), the entire disclosure of which is incorporated by reference herein, and provided by a commercial vendor such as NETZSCH Inc. of Exton, Pennsylvania.

Figure 6C:
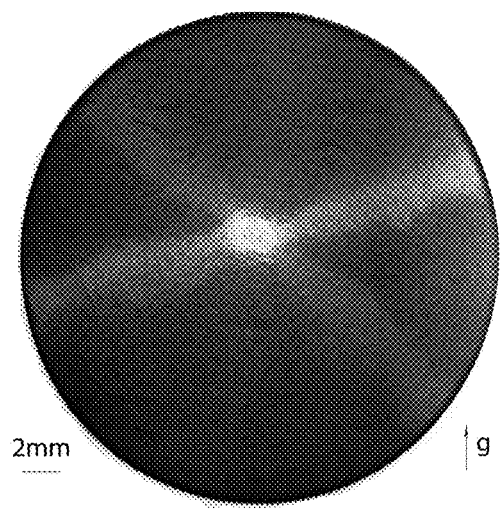
Figure 6D:
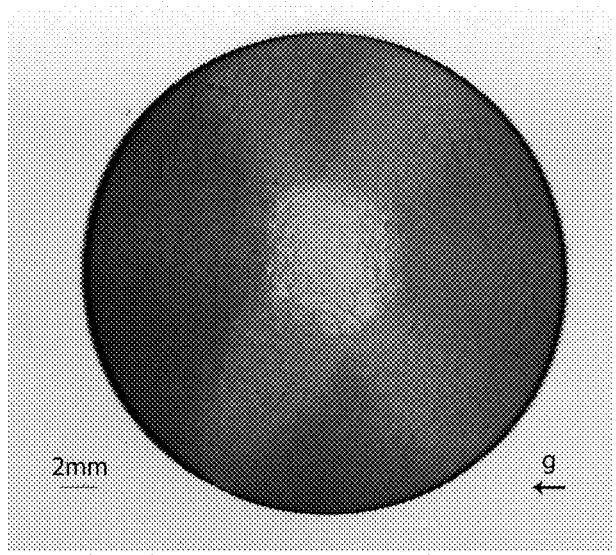
Figure 6E:
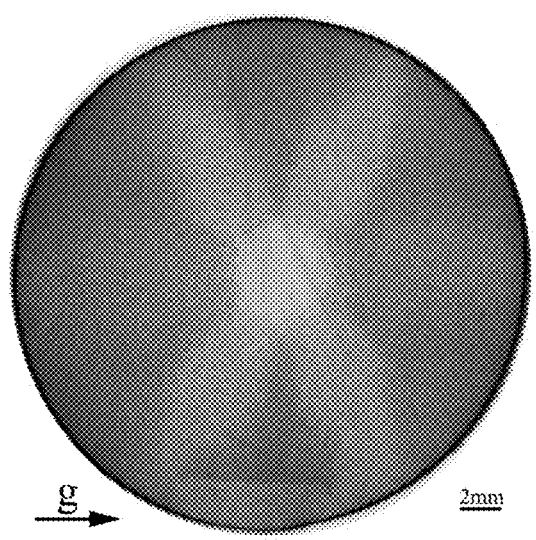

As mentioned previously, embodiments of the invention also, surprisingly, enable formation of AlN single crystals not only with large amounts of diameter expansion, and correspondingly high CAP values, but also with low densities of (or even zero) basal plane dislocations. FIGS. 6C-6E are white-beam topography images, in transmission geometry, of three different AlN single crystals (also referred to herein as Crystals A-C respectively) fabricated in accordance with embodiments of the present invention. As known to those of skill in the art, white-beam topography allows the delineation of most of the defects in the bulk of the crystal. For the images in FIGS. 6C-6E, the diffraction vector g is parallel to the [11-20] direction, and all three substrates have diameters of 25 mm and thicknesses of 550 µm. The average density of basal plane dislocations varies from $1.9\times10^5$ cm$^{-2}$ to $8.4\times10^3$ cm$^{-2}$ with center areas (e.g., areas having a diameter of at least approximately 3 mm and/or an area of at least approximately 7.1 mm$^2$) having basal plane dislocation densities of $7.6\times10^3$ cm$^{-2}$ (Crystal A), $8.5\times10^3$ cm$^{-2}$ (Crystal B), and 0 cm$^{-2}$ (Crystal C).

In accordance with embodiments of the present invention, basal plane dislocation density may be measured using x-ray topographic (XRT) imaging, for example XRT performed by White Beam X-ray Topography (SWBXT) and Synchrotron Monochromatic Beam X-ray Topography (SMBXT). White-beam and monochromatic topographs were recorded in transmission incidence geometry. In case of low defect density crystals, single dislocations may be recorded using gob analysis. The basal plane dislocation density may be determined by calculating the number of single dislocations and dividing that number by the topograph image area.

FIGS. 6F-6H are white-beam topography images, in transmission geometry, of three additional AlN single crystals (also referred to herein as Crystals D-F respectively) fabricated in accordance with embodiments of the present invention. For the images in FIGS. 6F-6H, the image size is 1.2 mm×0.9 mm, and all three substrates have diameters of 50 mm. The average density of basal plane dislocations varies from $8.0 \times 10^4$ cm$^{-2}$ to $8.2 \times 10^4$ cm$^{-2}$ with center areas (e.g., areas having a diameter of at least approximately 5-10 mm and/or an area of at least approximately 19.6-78.5 mm$^2$) having basal plane dislocation densities of $1.3 \times 10^4$ cm$^{-2}$ (Crystal D), $9.8 \times 10^3$ cm$^{-2}$ (Crystal E), and 0 cm$^{-2}$ (Crystal F). (Basal plane dislocations are evident in FIGS. 6F and 6G as white dots with tails extending therefrom, while the white dots present in FIG. 6H represent other crystallographic features and do not represent basal plane dislocations.)

As known to those of skill in the art, semiconductor substrates, e.g., single-crystal AlN substrates, are typically useful only when having standard dimensions and regular shapes. This allows the substrate to be loaded and processed by various semiconductor processing tools, e.g., ones for epitaxy, lithography, etc. Therefore, it is useful to gauge not only the quality of such substrates in terms of density of basal plane dislocations but also their utility for semiconductor processing.

Physically, a semiconductor wafer is usually shaped as a round, circular wafer that may have one or two flats depending on its crystallographic orientation. Round wafers are typically necessary for processing and handling and are therefore preferred in comparison to wafers having other shapes (e.g., hexagonal, square, etc.) or irregular shapes. Another important physical characteristic is the substrate thickness—it may not be too thick (e.g., greater than 1 mm) due to economic concerns. Substrates in accordance with embodiments of the present invention may have thicknesses in the range of approximately 250 µm to approximately 550 µm.

Accordingly, the substrate diameter is a vital wafer dimension that determines the number of devices that may be fabricated on the wafer and thus their cost. Obviously, substrates with larger diameter are desirable. On the other hand, thinner substrates are necessary to lower the cost of the substrate. When such considerations are taken into account, along with quality measured in terms of basal plane dislocation density, embodiments of the present invention enable the fabrication of AlN single-crystal substrates having large Substrate Versatility (SuV) metrics, where the SuV metric is defined as:

$$SuV = \frac{A}{[\log(BPD+0.1)+1.1] \times 10^t} \cong \frac{0.785 d^2}{[\log(BPD+0.1)+1.1] \times 10^t}$$

where A is the approximate substrate area in cm$^2$, d is the substrate diameter in cm, t is the substrate thickness in cm, and BPD is the basal plane dislocation density in cm$^{-2}$, for a center region of the substrate having an area of at least 1 mm$^2$. The SuV metric is therefore measured in cm$^2$. The SuV metric captures the practical and industrial usefulness of a semiconductor substrate with a particular basal plane dislocation density. Applicants have found that the basal plane dislocation density of the center region of the substrate, as described above, is representative of the overall quality of the substrate and is more easily measured. Applicants have also found that, if the basal plane dislocation density increases toward the edge of the substrate, any appreciable or significant increase occurs within approximately 2 mm from the edge of the substrate, i.e., a region typically falling with the edge-exclusion area when such substrates are surface-finished and utilized for device fabrication. The SuVs of the AlN single-crystal substrates shown in FIGS. 6C-6H are included in Table 2 below, along with SuVs of other AlN single-crystal substrates fabricated in accordance with embodiments of the present invention.

TABLE 2

| Crystal | Wafer thickness, µm | Wafer diameter, cm | BPD, cm$^{-2}$ | SuV, cm$^2$ |
|---|---|---|---|---|
| A (FIG. 6C) | 550 | 2.54 | $7.8 \times 10^3$ | 0.89 |
| B (FIG. 6D) | 550 | 2.54 | $5.1 \times 10^3$ | 0.93 |
| C (FIG. 6E) | 550 | 2.54 | 0 | 44.6 |
| D (FIG. 6F) | 550 | 5.08 | $1.3 \times 10^4$ | 3.42 |
| E (FIG. 6G) | 550 | 5.08 | $9.8 \times 10^3$ | 3.51 |
| F (FIG. 6H) | 550 | 5.08 | 0 | 178.5 |
| 1 | 500 | 2.5 | 0 | 43.7 |
| 2 | 500 | 0.5 | 0 | 1.7 |
| 3 | 500 | 5.0 | 0 | 174.9 |
| 4 | 500 | 10.0 | 0.1 | 174.5 |
| 5 | 500 | 10.0 | 0 | 699.6 |
| 6 | 500 | 15.0 | 1.0 | 137.9 |
| 7 | 500 | 15.0 | 0.5 | 179.3 |
| 8 | 300 | 2.5 | 0 | 45.8 |
| 9 | 300 | 5.0 | 1.0 | 16.0 |
| 10 | 300 | 5.0 | 0 | 183.2 |
| 11 | 300 | 10.0 | 1.0 | 64.2 |
| 12 | 300 | 10.0 | 0 | 732.6 |
| 13 | 300 | 15.0 | 100 | 53.2 |
| 14 | 300 | 15.0 | 1.0 | 144.4 |

AlN single-crystal substrates in accordance with embodiments of the present invention may have diameters of at least 25 mm, at least 50 mm, at least 100 mm, or at least 150 mm, and may have SuV values exceeding 1 cm$^2$, exceeding 3 cm$^2$, exceeding 5 cm$^2$, exceeding 10 cm$^2$, exceeding 30 cm$^2$, exceeding 50 cm$^2$, exceeding 60 cm$^2$, exceeding 70 cm$^2$, exceeding 80 cm$^2$, exceeding 90 cm$^2$, exceeding 100 cm$^2$, exceeding 140 cm$^2$, or exceeding 170 cm$^2$, for example. AlN single-crystal substrates in accordance with embodiments of the present invention may have SuV values less than 200 cm$^2$, less than 190 cm$^2$, less than 185 cm$^2$, or less than 180 cm$^2$, for example.

Table 3 below contains data for 19 different single-crystal AlN crystals grown using different growth conditions, where the nominal crystal size represents the diameter of the wafer produced from the boule, and the summed expansion length corresponds to the sum of dimension 120 (FIG. 1C) and dimension 126 (FIG. 1D). That is, the summed expansion length represents the approximate length of the boule during which the diameter is expanded and at which the diameter of the boule is at its maximum.

TABLE 3

| Crystal | Nominal size, cm | Boule length, mm | Summed expansion length, mm | CAP, mm | BPD, cm$^{-2}$ | SuV, cm$^2$ |
|---|---|---|---|---|---|---|
| A (FIG. 6C) | 2.54 | 17.0 | 12.5 | 44 | $7.8 \times 10^3$ | 0.89 |
| B (FIG. 6D) | 2.54 | 18.0 | 12.0 | 45 | $5.1 \times 10^3$ | 0.93 |
| C (FIG. 6E) | 2.54 | 21.7 | 14.2 | 44 | 0 | 44.6 |
| D (FIG. 6F) | 5.08 | 22.7 | 8.3 | 155 | $1.3 \times 10^4$ | 3.42 |
| E (FIG. 6G) | 5.08 | 24.9 | 11.7 | 97 | $9.8 \times 10^3$ | 3.51 |
| F (FIG. 6H) | 5.08 | 26.3 | 15.0 | 17 | 0 | 178.5 |
| G | 2.54 | 21.3 | 13.9 | 44 | $1.4 \times 10^4$ | 0.85 |
| H | 2.54 | 21.9 | 12.5 | 49 | $6.1 \times 10^3$ | 0.91 |
| I | 2.54 | 17.2 | 11.9 | 43 | $1.4 \times 10^4$ | 0.85 |
| J | 2.54 | 15.0 | 11.7 | 37 | $1.0 \times 10^4$ | 0.87 |

TABLE 3-continued

| Crystal | Nominal size, cm | Boule length, mm | Summed expansion length, mm | CAP, mm | BPD, cm$^{-2}$ | SuV, cm$^2$ |
|---|---|---|---|---|---|---|
| K | 2.54 | 20.3 | 12.9 | 46 | $1.6 \times 10^4$ | 0.84 |
| L | 2.54 | 21.9 | 13.5 | 48 | $1.8 \times 10^4$ | 0.83 |
| M | 2.54 | 20.9 | 11.8 | 48 | $1.3 \times 10^4$ | 0.86 |
| N | 2.54 | 19.1 | 12.7 | 42 | $5.71 \times 10^3$ | 0.92 |
| O | 5.08 | 22.5 | 8.0 | 129 | $1.0 \times 10^6$ | 2.51 |
| P | 5.08 | 18.5 | 12.5 | 74 | $1.0 \times 10^6$ | 2.51 |
| Q | 5.08 | 24.4 | 10.0 | 118 | $1.0 \times 10^5$ | 2.93 |
| R | 5.08 | 20.7 | 11.0 | 101 | $1.0 \times 10^5$ | 2.93 |
| S | 5.08 | 24.9 | 11.7 | 90 | $1.6 \times 10^4$ | 3.36 |

As may be seen in Table 3, embodiments of the present invention in which the CAP is no greater than 44 mm, and in which the summed expansion length is greater than 14 mm, enable the fabrication of AlN single crystals in which the basal plane dislocation density is zero, at least in center regions thereof. Such crystals enable the fabrication of single-crystal AlN substrates having SuV metrics greater than approximately 40 cm$^2$, or even greater than approximately 150 cm$^2$. Such crystals and wafers are of superior utility and quality for the fabrication of electronic and optoelectronic devices when compared to conventional AlN crystals.

As will be evident to those of skill in the art, the summed expansion length will be approximately equal to the expansion length for crystals having no, or very short, expanded regions in which expansion has been completed and the crystal has achieved its maximum diameter, such as those depicted in FIGS. 1B and 1C. As will also be evident, the summed expansion length will be approximately equal to the length of the expanded region for crystals having very short expansion lengths, such as those depicted in FIG. 1D. Thus, in various embodiments, depending upon the specific boule geometry, AlN single crystals in which the basal plane dislocation density is zero, at least in center regions thereof, may have (i) expansion lengths greater than 14 mm, (ii) lengths of expanded regions greater than 14 mm, and/or (iii) summed expansion lengths greater than 14 mm. Additional embodiments of the present invention in which the basal plane dislocation density is zero may have summed expansion lengths greater than 15 mm, greater than 22 mm, or even greater than 25 mm.

Figure 7A:
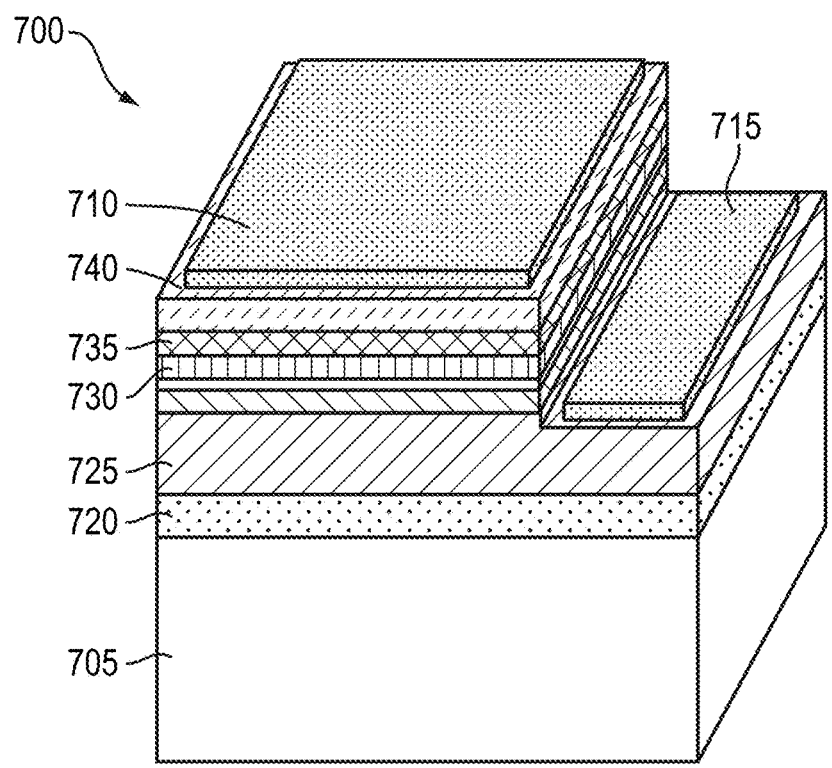
FIG. 7A is a schematic diagraph of a light-emitting device fabricated in accordance with various embodiments of the invention.
Figure 7B:
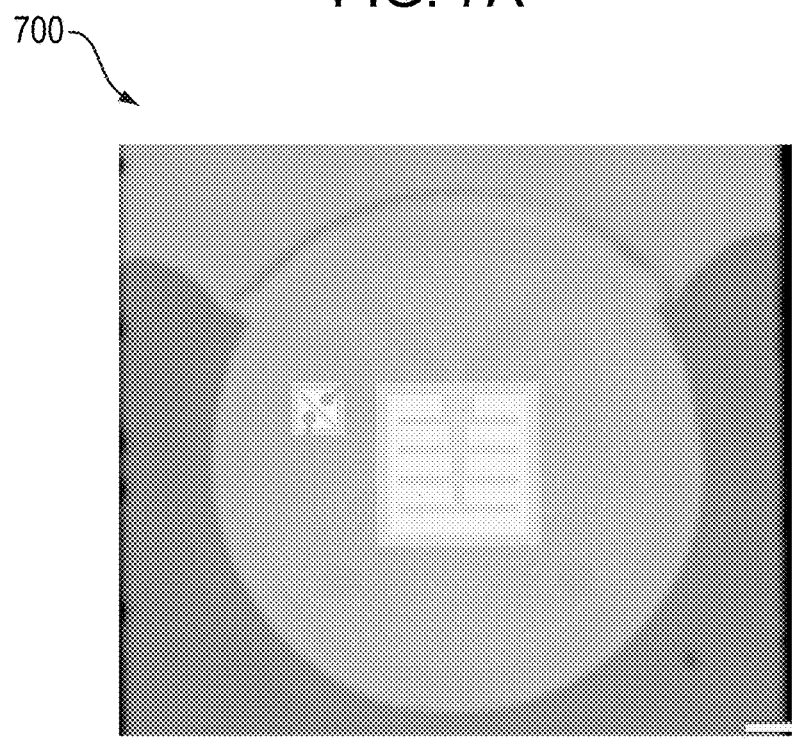
FIG. 7B is a plan view photograph of the light-emitting device of FIG. 7A during emission of light having a peak wavelength of approximately 230 nm in accordance with various embodiments of the invention.

FIG. 7A is a schematic view of a UV LED 700 fabricated on an AlN substrate in accordance with embodiments of the present invention. As shown, the UV LED 700 features a set of layers epitaxially grown over an AlN substrate 705 and two top-side metal contacts 710, 715. Specifically, immediately above the substrate is a 500 nm layer 720 of undoped (i.e., unintentionally doped) AlN, topped with a bottom contact layer 725 of n-doped (with Si at a concentration of $2 \times 10^{18}$ cm$^{-3}$) Al$_{0.83}$Ga$_{0.17}$N that is 500 nm thick. Above the bottom contact layer 725 is a multiple-quantum-well (MQW) layer 730 featuring five sets of a 2 nm thick Al$_{0.78}$Ga$_{0.22}$N quantum well and a 6 nm thick Al$_{0.85}$Ga$_{0.15}$N barrier, all of which are undoped. Above the MQW layer 730 is a 10 nm thick electron-blocking layer formed of undoped Al$_{0.95}$Ga$_{0.05}$N. Above the electron-blocking layer is an undoped graded layer 735 graded from Al$_{0.95}$Ga$_{0.05}$N to GaN over a thickness of 30 nm. Finally, over the graded layer 735 is a 10 nm thick p-doped (with Mg at a concentration of $1 \times 10^{19}$ cm$^{-3}$) GaN cap layer 740. The p-metal layer 710 is formed over the cap layer 740, while the n-metal layer 715 is formed over the bottom contact layer 725 (revealed by etching away the overlying structure, for example). FIG. 7B is a plan-view photograph of the UV LED 700 of FIG. 7A when emitting light at approximately 230 nm. Devices such as that depicted in FIGS. 7A and 7B exhibited output powers between 20 μW and 500 μW at currents of 20 mA and at room temperature, continuous wave (CW) operation. Such output powers are indicative of external quantum efficiencies ranging from 0.02% to 0.5% in the wavelength range of 228 nm to 238 nm.

After formation of the electrodes (e.g., contacts 710, 715), the resulting light-emitting device may be electrically connected to a package, for example as detailed in U.S. Pat. No. 9,293,670, filed on Apr. 6, 2015 (the '670 patent), the entire disclosure of which is incorporated by reference herein. A lens may also be positioned on the device to transmit (and, in various embodiments, shape) the light emitted by the device. For example, a rigid lens may be disposed over the device as described in the '670 patent or in U.S. Pat. No. 8,962,359, filed on Jul. 19, 2012, or in U.S. Pat. No. 9,935,247, filed on Jul. 23, 2015, the entire disclosure of each of which is incorporated by reference herein. After packaging, any remaining portion of the substrate may be removed.

In accordance with embodiments of the invention, various techniques for partial or complete substrate removal may be utilized if desired. For example, etching techniques, such as electrochemical etching techniques described in U.S. patent application Ser. No. 16/161,320, filed on Oct. 16, 2018, the entire disclosure of which is incorporated by reference herein, may be utilized. In other embodiments, techniques like those utilized in U.S. patent application Ser. No. 15/977,031, filed on May 11, 2018, may be utilized.

AlN crystals, and wafers produced therefrom, in accordance with embodiments of the present invention may also advantageously exhibit high levels of UV transparency, even at deep-UV wavelengths, for example as described in U.S. patent application Ser. No. 16/444,147, filed on Jun. 18, 2019 (the '147 application), the entire disclosure of which is incorporated by reference herein. For example, embodiments of the invention include techniques for the control and reduction of carbon content in the source material utilized to grow the AlN single crystal and UV-transparency enhancement via thermal treatments, as detailed below.

In various embodiments, the polycrystalline AlN ceramic may be fabricated in accordance with the techniques described in U.S. Pat. No. 9,447,519 (the '519 patent), the entire disclosure of which is incorporated by reference herein, i.e., a "pellet-drop" technique using high-purity Al pellets melted in the presence of nitrogen to form AlN polycrystalline ceramic material. In various embodiments, the ceramic is broken up into fragments to facilitate removal of much of the carbon therefrom. The ceramic may be fragmented by, e.g., application of mechanical force. The present inventors have found that, surprisingly, much of the carbon present in the polycrystalline AlN ceramic remains on smaller fragments and/or dust (e.g., particles having large aggregate surface area and/or having diameters less than about 2 mm) resulting from the fragmentation process, while larger fragments (e.g., ones having widths, diameters, or other lateral dimensions ranging from 0.5 cm to 2 cm) exhibit smaller carbon concentrations. In various embodiments, the fragments of the AlN ceramic may be separated on the basis of size using one or more sieves, and/or compressed air or another fluid (e.g., nitrogen or an inert gas such as argon) may be applied to the fragments to minimize or reduce the amount of dust or other particles thereon. For example, as reported in the '147 application, the entire disclosure of which is incorporated by reference herein, after fragmentation and separation, the larger fragments have carbon concentrations that range from approximately 5 ppm to approximately 60 ppm, with an average carbon concentration of approximately 26 ppm. In stark contrast, the resulting powder and smaller fragments have carbon concentrations that range from approximately 108 ppm to approximately 1800 ppm, with an average carbon concentration of approximately 823 ppm.

Thus, in accordance with various embodiments of the invention, one or more of the larger fragments of the AlN polycrystalline ceramic, once separated from the smaller fragments and powder, may be utilized directly as the source material for formation of single-crystal AlN (as detailed above). In other embodiments, one or more (typically more) of the fragments are collected and placed into a crucible (e.g., a tungsten (W) vessel) for subsequent heat treatment. (While in preferred embodiments only the larger fragments of the polycrystalline AlN ceramic are heat treated, embodiments of the invention do encompass heat treatment of the entire, unfragmented ceramic.)

In various embodiments, the optional subsequent preparation stage involves an annealing and densification treatment of at least a portion of the polycrystalline AlN ceramic (e.g., one or more larger fragments thereof) to form high-quality polycrystalline AlN source material. In accordance with various embodiments of the invention, the AlN ceramic (or portion thereof) may be heated to a first temperature T1 ranging from 1100° C. to 2000° C. and held at temperature T1 for a time period t1 of, for example, 2 hours to 25 hours. Thereafter, the ceramic (or portion thereof) may be heated to a higher second temperature T2 (e.g., a temperature ranging from 2000° C. to 2250° C.) and held at temperature T2 for a time period t2 of, for example, 3 hours to 15 hours. During the heat treatment, the ceramic (or portion thereof) is annealed and densified to form a polycrystalline AlN source material that may be utilized in the subsequent formation of single-crystal AlN bulk crystals. Because the polycrystalline AlN source material is generally approximately stoichiometric AlN with low concentrations of impurities, it may be used to form an AlN bulk crystal without further preparation (e.g., without intermediate sublimation-recondensation steps).

In an alternative heat treatment in accordance with embodiments of the invention, a longer ramp to temperature T2 is utilized in place of the first annealing step at temperature T1. In accordance with various embodiments of the invention, the AlN ceramic (or portion thereof) may be ramped to temperature T2 (e.g., a temperature ranging from 2000° C. to 2250° C.) over a time period t1 ranging from, for example, 5 hours to 25 hours. Thereafter, the ceramic (or portion thereof) may be held at temperature T2 for a time period t2 of, for example, 3 hours to 25 hours. During the heat treatment, the ceramic (or portion thereof) is annealed and densified to form a polycrystalline AlN source material that may be utilized in the subsequent formation of high-quality single-crystal AlN bulk crystals. Because the polycrystalline AlN source material is generally approximately stoichiometric AlN with low concentrations of impurities, it may be used to form an AlN bulk crystal without further preparation (e.g., without intermediate sublimation-recondensation steps).

In various embodiments, the carbon concentration of the polycrystalline AlN source material, as measured by instrumental gas analysis (IGA), ranges from approximately $3.0 \times 10^{18}$ cm$^{-3}$ to approximately $1.8 \times 10^{19}$ cm$^{-3}$, approximately $3.8 \times 10^{18}$ cm$^{-3}$ to approximately $1.2 \times 10^{19}$ cm$^{-3}$, or even from approximately $3.0 \times 10^{18}$ cm$^{-3}$ to approximately $9.0 \times 10^{18}$ cm$^{-3}$. After the optional densification heat treatment, the density of the polycrystalline AlN source material, as measured by pycnometry at room temperature, may be approximately equal to that of single-crystal AlN, i.e., approximately 3.25 g/cm$^3$ to 3.26 g/cm$^3$. In various embodiments, the measured density of the AlN ceramic without the densification heat treatment may be lower, e.g., approximately 2.95 g/cm$^3$ to approximately 3.20 g/cm$^3$. In various embodiments, after the optional densification heat treatment, the polycrystalline AlN source material typically has an amber color and is composed of fairly large grains (e.g., average grain diameter ranging from approximately 0.1 mm to approximately 5 mm).

Referring back to FIG. 2, in accordance with embodiments of the invention, one or more internal parts of the crystal-growth apparatus 200 (e.g., the crucible 205, the susceptor 215, and/or the crucible stand 210) may be annealed before crystal growth and formation of AlN boule 220, and such annealing may advantageously decrease the carbon concentration in the AlN boule 220. In various embodiments, the one or more internal parts of the crystal-growth apparatus 200 may be annealed at, for example, a temperature ranging from approximately 1000° C. to approximately 1800° C. for a time period of approximately 5 hours to approximately 50 hours.

In various embodiments of the invention, the concentration of carbon within the AlN boule 220 may be decreased via the introduction of one or more gettering materials within the crucible 205 prior to and during growth of the AlN boule 220. The gettering materials may be introduced as a portion or all of one or more of the components of the crystal-growth apparatus 200 (e.g., the crucible 205, a liner situated within the crucible 205 and proximate an interior surface or wall thereof, the susceptor 215, and/or the crucible stand 210), and/or the gettering materials may be introduced as discrete masses of material within the crystal-growth apparatus 200. The gettering materials may be disposed between the source material 230 and the growing AlN boule 220 in order to, e.g., getter or absorb contaminants such as carbon from the vapor flowing toward the AlN boule 220 (i.e., toward the seed crystal 235). In various embodiments, the gettering materials are stable at and have melting points greater than the growth temperature (e.g., greater than approximately 2000° C.) and have low vapor pressures to prevent contamination of the growing AlN boule 220 with the gettering materials themselves. In various embodiments, a gettering material has a eutectic melting point with AlN that is greater than the growth temperature (e.g., greater than approximately 2000° C.). Examples of gettering materials in accordance with embodiments of the present invention include boron (melting point of approximately 2300° C.), iridium (melting point of approximately 2410° C.), niobium (melting point of approximately 2468° C.), molybdenum (melting point of approximately 2617° C.), tantalum (melting point of approximately 2996° C.), rhenium (melting point of approximately 3180° C.), and/or tungsten (melting point of approximately 3410° C.). In various embodiments, the gettering material (or the component of the apparatus 200 or portion thereof) may include, consist essentially of, or consist of one or more non-tungsten materials having melting temperatures of at least approximately 2300° C.

After growth of the AlN boule 220, the AlN boule 220 may be cooled down to approximately room temperature for subsequent removal from the crystal-growth apparatus 200. For example, the AlN boule 220 may be cooled in a two-stage process as described in the '519 patent. However, in various embodiments of the invention, the AlN boule 220 may simply be cooled down from the growth temperature in a single stage, at an arbitrary rate, as the heat treatment detailed below obviates the need for the two-stage process of the '519 patent. In fact, in various embodiments of the present invention, the AlN boule 220 is cooled down from the growth temperature to approximately room temperature at a high rate (e.g., greater than 70° C./hour, greater than 80° C./hour, greater than 100° C./hour, greater than 150° C./hour, greater than 200° C./hour, greater than 250° C./hour, greater than 300° C./hour, greater than 400° C./hour, or even greater than 500° C./hour; in various embodiments, the rate may be no more than 2000° C./hour, 1500° C./hour, or 1000° C.) without any "controlled cooling" achieved via application of power to the heating elements of crystal-growth apparatus 200. In various embodiments of the invention, gas (e.g., nitrogen and/or an inert gas) is flowed within the crystal-growth apparatus 200 at a high rate (e.g., a rate approximately equal to or higher than any gas-flow rate utilized during crystal growth) in order to cool the AlN boule 220. For example, the gas-flow rate utilized during crystal growth may be approximately 4 slm or less, approximately 3 slm or less, approximately 2 slm or less, or approximately 1 slm or less. The gas-flow rate utilized during crystal growth may be approximately 0.1 slm or more, approximately 0.5 slm or more, approximately 1 slm or more, or approximately 2 slm or more. In various embodiments, the gas-flow rate utilized during cooling may be approximately 5 slm or more, approximately 10 slm or more, approximately 15 slm or more, approximately 20 slm or more, or approximately 25 slm or more. The gas-flow rate utilized during cooling may be approximately 30 slm or less, approximately 25 slm or less, approximately 20 slm or less, approximately 15 slm or less, or approximately 10 slm or less. In addition, in embodiments of the invention, the crucible 205 (and thus the AlN boule 220 therewithin) may be moved to an edge of the hot zone, or above the hot zone, formed by the heating elements of the crystal-growth apparatus 200 in order to more rapidly cool the AlN boule 220.

Advantageously, the high-rate cooling of AlN boule 220 minimizes or eliminates the formation of cracks within the AlN boule 220, particularly when the AlN boule 220 has a diameter of approximately 50 mm or greater. However, the high cooling rate may also result in deleteriously high UV absorption within the AlN boule 220 at one or more wavelengths (e.g., wavelengths around approximately 310 nm), as described in the '147 application. FIG. 3A depicts the UV absorption spectrum for an exemplary AlN boule 220 cooled quickly from the growth temperature as detailed herein. For example, the UV absorption spectrum of an exemplary AlN boule 220 cooled quickly from the growth temperature may exhibit an elevated peak at approximately 310 nm that impairs the UV transparency of the crystal over a wide range of wavelengths, and the UV absorption coefficient may be greater than 20 cm$^{-1}$ over the entire wavelength range of 210 nm to 400 nm. The UV absorption coefficient may also be greater than 30 cm$^{-1}$ over the wavelength range of 210 nm to 380 nm. Thus, in accordance with various embodiments of the present invention, control of various impurity concentrations such as carbon during the growth of and within the resulting AlN crystal may be insufficient to achieve low UV absorption coefficients, particularly at deep-UV wavelengths (e.g., between 210 nm and 280 nm, between 230 nm and 280 nm, or between 210 nm and 250 nm).

After cooling to room temperature, the AlN boule 220, or a portion thereof, may be heat treated to further improve its UV transparency, particularly at deep-UV wavelengths. For example, one or more wafers may be separated from AlN boule 220, as detailed herein, and one or more of the wafers may be heat treated for improvement of UV transparency. The ensuing description refers to the heat treatment of the AlN boule 220, but it should be understood that only one or more portions of the boule (e.g., one or more wafers) may be heat treated, rather than the entire boule. In addition, the heat treatments detailed herein may be performed on various different AlN crystals (e.g., AlN single crystals), even if not initially grown and cooled as detailed herein, in order to improve UV absorption.

In various embodiments of the invention, the AlN boule 220 is annealed in a heating apparatus (e.g., a furnace such as a resistive furnace or a radio-frequency (RF) furnace) configured for substantially isothermal or quasi-isothermal heating. The interior of the furnace (at least in the heated, or "hot" zone), as well as any hardware (e.g., a platform or other support) within the furnace, may include, consist essentially of, or consist of one or more refractory materials (e.g., W or another refractory metal) having a melting point exceeding about 2800° C., or even exceeding about 3000° C. In various embodiments, the interior of the furnace (at least in the heated, or "hot" zone), and the hardware (e.g., a platform or other support) within the furnace, may be free of carbon, carbon-based or carbon-containing materials, graphite, quartz, alumina, and/or molybdenum. Before the AlN boule 220 is placed within the furnace, the furnace may undergo a bake-out run at high temperature to reduce or minimize the presence of any contaminants therewithin. For example, the furnace may be heated to about 2600° C. under vacuum for a time period of, e.g., approximately 0.5 hours to approximately 2 hours. After the furnace has cooled, the AlN boule 220 may be placed within the furnace, which may then be filled with nitrogen gas at a pressure of, e.g., approximately 1 bar to approximately 2 bars. The AlN boule 220 may be placed "loosely" (i.e., not attached, adhered, or fastened to) on a platform within the furnace that may include, consist essentially of, or consist of W or another refractory metal. In various embodiments, the loose placement of the AlN boule 220 reduces or substantially eliminates stresses due to any differential thermal expansion between AlN boule 220 and the platform.

The temperature within the furnace may then be ramped to the desired annealing temperature at a ramp rate of, e.g., approximately 1° C./min to approximately 50° C./min. In various embodiments, the annealing temperature is between approximately 2100° C. and approximately 2500° C., e.g., approximately 2400° C. In various embodiments, the annealing temperature is between approximately 2150° C. and approximately 2400° C. The present inventors have found that lower annealing temperatures (e.g., about 2000° C.) are generally insufficient to improve the UV transparency of AlN boule 220 at deep-UV wavelengths to the desired level. Once the desired annealing temperature has been achieved, the AlN boule 220 is annealed at that temperature for a time period of, for example, approximately 0.5 hour to approximately 100 hours, approximately 0.5 hour to approximately 5 hours, or approximately 1 hour. After annealing, the temperature of the furnace is slowly ramped down to an intermediate temperature (for example, between approximately 800° C. and approximately 1200° C., e.g., approximately 1000° C.) at a rate ranging between approximately 60° C./hour and approximately 120° C./hour. For example, the furnace may be cooled from an exemplary annealing temperature of 2200° C. to 1000° C. over a time period of 15 hours. Such slow cooling may be achieved via controlled application of heat with the furnace (e.g., at low power levels). Thereafter, the furnace may be turned off, and the furnace and the AlN boule 220 may be allowed to cool to room temperature. Thus, in various embodiments of the invention, the entire annealing cycle, including the cool-down therefrom, of the AlN boule 220 is performed in substantially isothermal or quasi-isothermal conditions.

Figure 8:
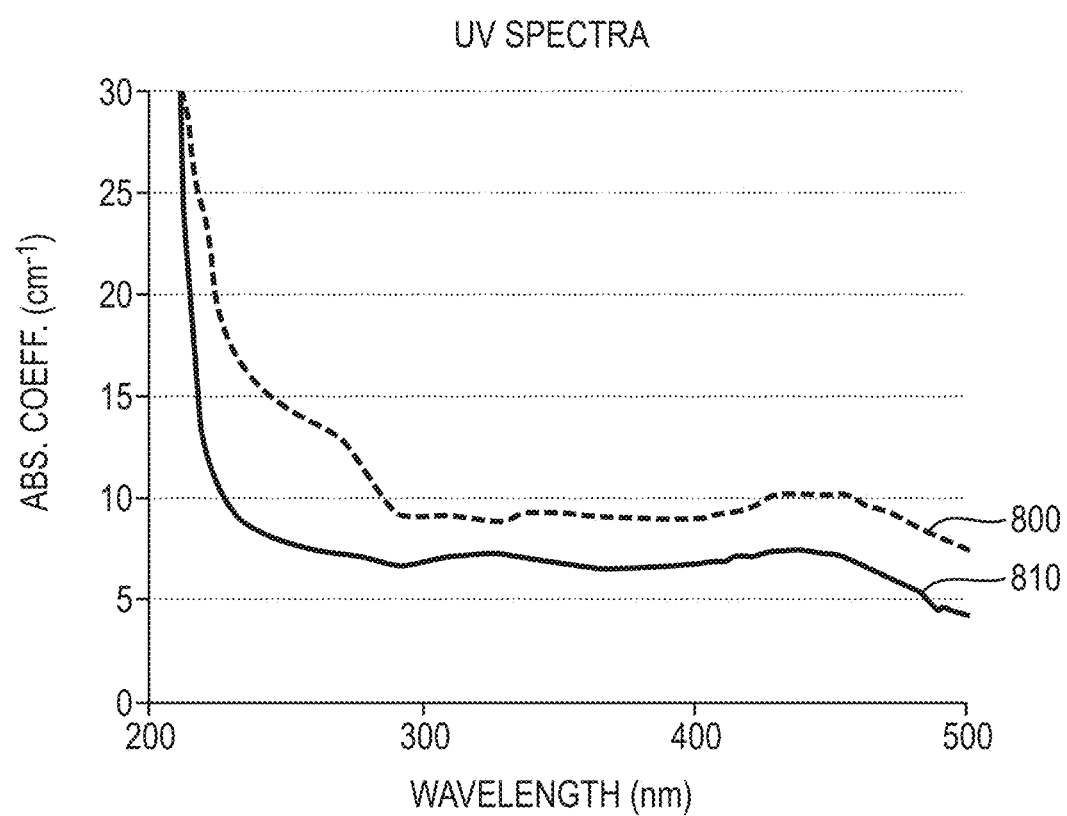
FIG. 8 is a comparative graph of UV absorption coefficients, as functions of wavelength, of conventional single-crystal AlN and single-crystal AlN grown and annealed in accordance with various embodiments of the invention.

FIG. 8 is a graphical comparison of a UV absorption spectrum 800, corresponding to a conventional UV absorption spectrum reported in the '519 patent and a UV absorption spectrum 810 of an AlN single crystal fabricated and annealed in accordance with embodiments of the present invention. As shown, over the entire range of wavelengths, the crystal in accordance with embodiments of the invention exhibits a lower absorption coefficient, and the spectrum is substantially constant (or "flat") for wavelengths between 210 nm and 280 nm. At about 230 nm, the crystal in accordance with embodiments of the invention has an absorption coefficient of less than 10 cm$^{-1}$ (in the depicted example, approximately 7 cm$^{-1}$-8 cm$^{-1}$), which is dramatically lower than the results achieved in the '519 patent. In addition, the slope of the absorption coefficient as a function of wavelength near the band edge is much steeper, as described in more detail below.

As mentioned above, embodiments of the present invention include and enable the production of single-crystal AlN having a steep drop-off in the absorption coefficient near the band edge, i.e., AlN having a low Urbach energy. The "Urbach tail" is the exponential part of the absorption coefficient curve near the optical band edge, and is related to crystalline disorder and localized electronic states extending into the band gap. The spectral dependence of the absorption coefficient ($\alpha$) and photon energy (hν) is known as Urbach empirical rule, which is given by the following equation:

$$\alpha = \alpha_0 \exp\left(\frac{h\nu}{E_U}\right)$$

(see Franz Urbach, "The Long-Wavelength Edge of Photographic Sensitivity and of the Electronic Absorption of Solids," Phys. Rev. 92 (1953) 1324, the entire disclosure of which is incorporated by reference herein). $\alpha 0$ is a constant, and $E_U$ is the Urbach energy, i.e., the energy of the band tail. The above equation may be rewritten as:

$$\ln \alpha = \ln \alpha_0 + \left(\frac{h\nu}{E_U}\right)$$

and the Urbach energy may be determined from the slope of the line when ln ($\alpha$) is plotted as a function of the incident photon energy hν; on such a plot, ln ($\alpha_0$) is the y-intercept of the line and thus corresponds to ln ($\alpha$) at a theoretical zero photon energy. Specifically, the Urbach energy is the inverse of the slope.

Figure 9:
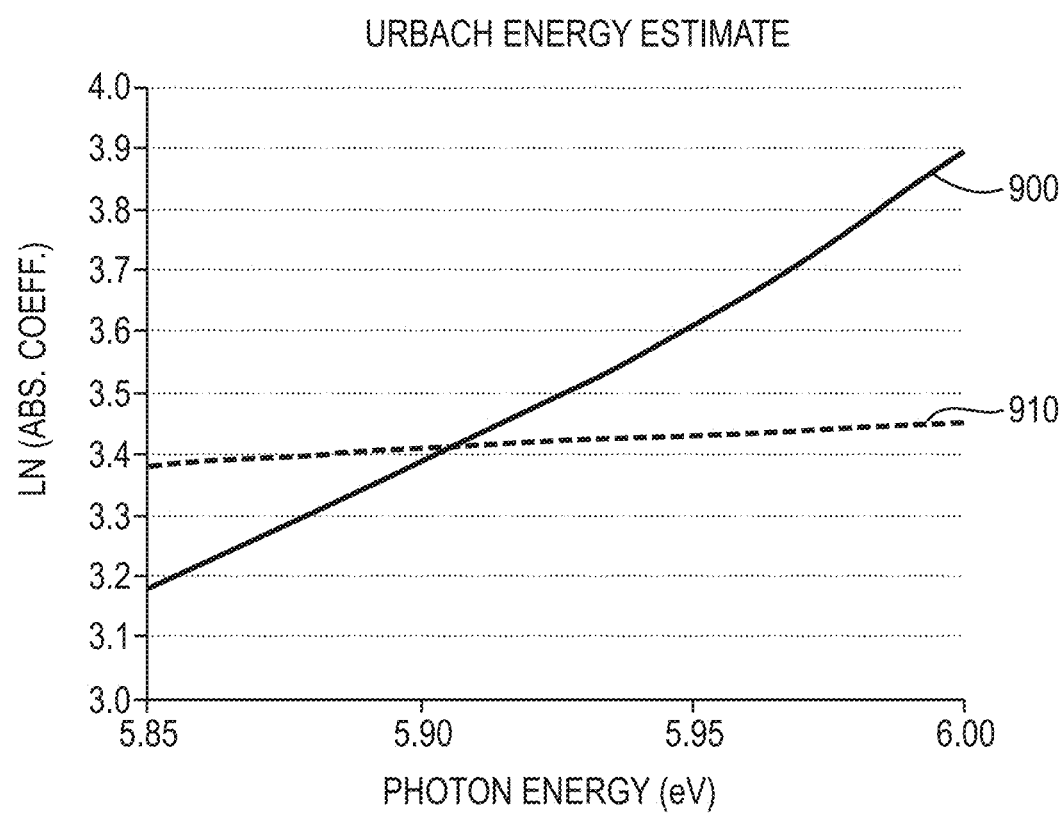
FIG. 9 is a graph utilized to estimate Urbach energies of the AlN samples of FIG. 8 in accordance with various embodiments of the invention.

FIG. 9 is a plot used to determine the Urbach energy of the sample from the '519 patent having the absorption spectrum 800 presented in FIG. 8 as well as the Urbach energy of the sample in accordance with embodiments of the invention having the absorption spectrum 810 presented in FIG. 8. As shown, the slope of the resulting curve 900 for the inventive sample is much steeper (the slope is approximately 4.7/eV) and results in an Urbach energy of approximately 0.21 eV in the range of photon energies of 5.85 eV to 6.00 eV. In stark contrast, the curve 910 corresponding to the sample having the absorption spectrum 800 exhibits a slope of approximately 0.5/eV, which results in an Urbach energy of approximately 2.0 eV. In accordance with embodiments of the invention, the present inventors have fabricated samples having Urbach energies ranging from approximately 0.2 eV to approximately 1.8 eV, e.g., from approximately 0.21 eV to approximately 1.0 eV, which are significantly lower than those of conventional samples and samples reported in the literature.

Figure 10:
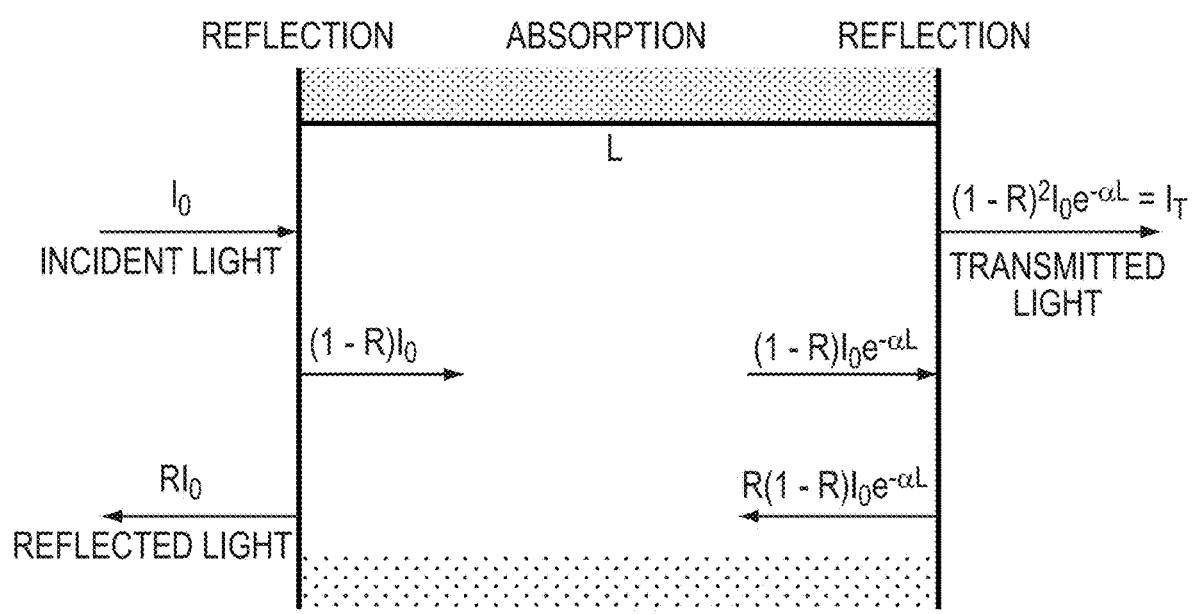
FIG. 10 is a schematic diagram of various components of light utilized to determine UV absorption spectra and Urbach energies in accordance with various embodiments of the invention.

In general, UV absorption spectra (and Urbach energies derived therefrom) may be determined by measuring reflections of incident light on a sample using a spectrometer. For example, the UV absorption spectra of samples in accordance with embodiments of the invention were measured using a V-670 (Class I) spectrometer and X-Y stage from Jasco Corporation. 52 points per sample were measuring utilizing a two-axis stage controller from Chuo Precision Industrial Co., Ltd. Wavelengths from 200 nm to 800 nm were measured, but measurements up to wavelengths of 2000 nm may be acquired utilizing this set-up. The absorption spectrum of a sample having a thickness L is estimated based on the light incident on the sample and the light transmitted by the sample, taking into account the light reflected back toward the light emission from both surfaces of the sample. The thickness L may be measured using, for example, a gauge (e.g., ACANTO, CERTO, METRO, or SPECTO length gauges, and associated GAGE-CHEK evaluation electronics, available from Heidenhain Corp. of Schaumburg, IL) or an optical system such as the ULTRA-MAP 100B or ULTRA-MAP C200, available from MicroSense, LLC of Lowell, MA. FIG. 10 summarizes this calculation, and absorption coefficient $\alpha$ at a particular wavelength of incident light $\lambda$ may be calculated from:

$$\frac{I_T}{I_0} = (1-R)^2 e^{-\alpha L}$$

where $I_T$ is the intensity of the transmitted light and $I_0$ is the intensity of the incident light. The reflectance R may be determined from:

$$R = \left(\frac{n-1}{n+1}\right)^2$$

where the refractive index n may be determined from the dispersion formula:

$$n^2 - 1 = 2.1399 + \frac{1.3786\lambda^2}{\lambda^2 - 0.1715^2} + \frac{3.861\lambda^2}{\lambda^2 - 15.03^2}$$

and where dispersion formula is provided from J. Pastrnik and L. Roskovcovi, "Refraction index measurements on AlN single crystals," Phys. Stat. Sol. 14, K5-K8 (1966), the entire disclosure of which is incorporated by reference herein.

Figure 11:
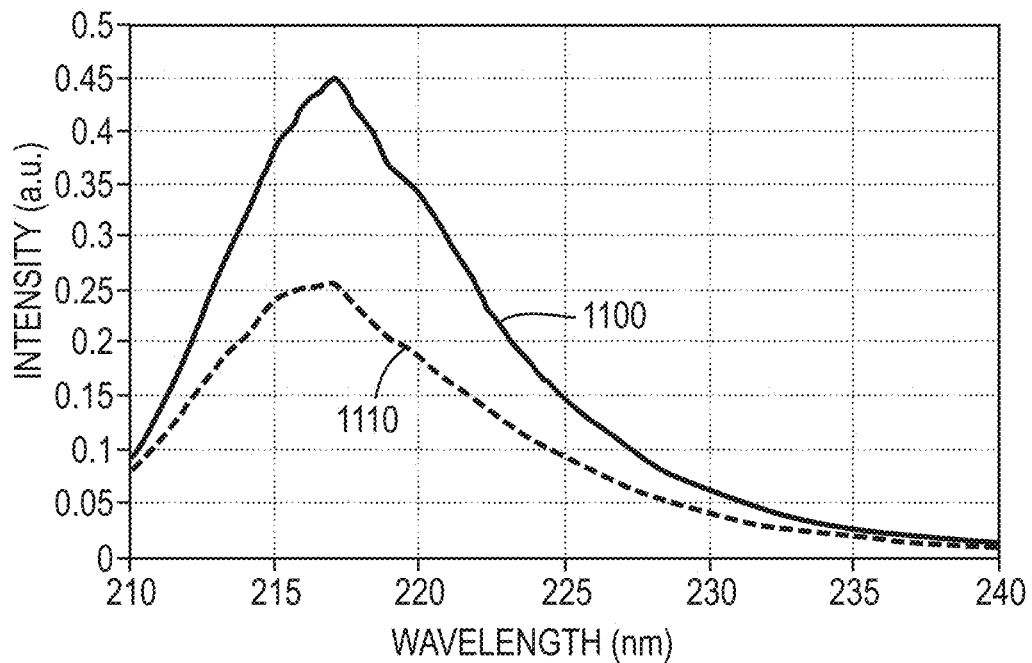
FIG. 11 is a comparative graph of emission intensity as a function of wavelength for simulated LEDs emitting light having a peak wavelength at about 217 nm in accordance with various embodiments of the invention.
Figure 12:
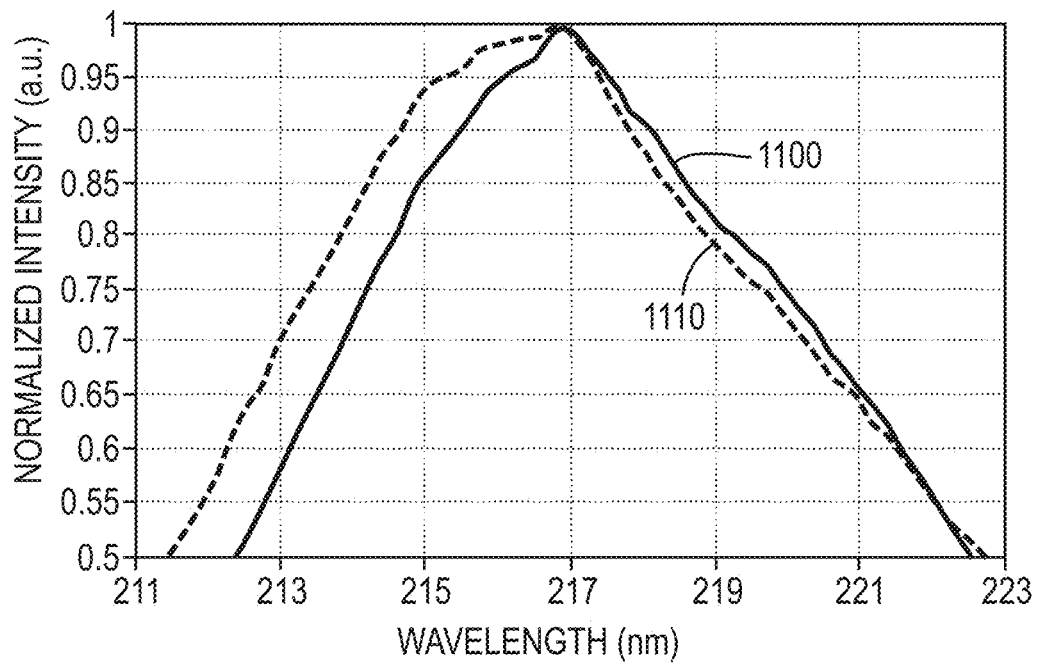
FIG. 12 is a comparative graph of the emission spectra of FIG. 11 in which the relative intensities of the LEDs have been independently normalized to the same value in order to demonstrate the narrower intensity peak of the device in accordance with embodiments of the present invention.

The improved UV absorption spectra of embodiments of the present invention enable enhanced performance of light-emitting devices (e.g., lasers and light-emitting diodes (LEDs)) fabricated on AlN substrates having the improved spectra, particularly at short wavelengths. FIG. 11 is a graph of LED device emission intensity as a function of wavelength for simulated LEDs emitting at about 217 nm. The top curve 1100 is the emission intensity as a function of wavelength for an LED fabricated on a substrate having the improved absorption spectrum enabled by embodiments of the present invention—in this example, the UV absorption spectrum 810 depicted in FIG. 8. The bottom curve 1110 corresponds to the same LED structure fabricated on a substrate having the absorption spectrum 800 of FIG. 8). As shown in FIG. 11, the emission intensity enabled by embodiments of the present invention is increased by nearly a factor of two at the peak emission wavelength of about 217 nm and is higher over the entire wavelength range. FIG. 12 is a graph of the same spectra over a smaller wavelength range, in which the relative intensities of the LEDs have been independently normalized to the same value in order to demonstrate the narrower intensity peak of the device in accordance with embodiments of the present invention. This narrower peak enables superior LED performance. The simulations for the devices depicted in FIGS. 11 and 12 indicate that the emission power for the device in accordance with embodiments of the invention will be increased by at least 1.6× for the substrate thickness of 0.55 mm utilized in the simulations. Due to the improved UV absorption, this advantage will be larger for larger substrate thicknesses. In addition, when reflectors are utilized to reflect light emitted by the device into a preferred direction, the power of the device will increase for each pass through the substrate traveled by the reflected light. For example, the improvement in device emission power enabled by embodiments of the present invention may be approximated as $2 \times (1.6)^3$, or approximately 8×, when reflected light traverses the substrate having the improved absorption spectrum three times.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or the like techniques that some would refer to as "high-temperature CVD." Also, other terms are sometimes used to describe these and that are used to grow bulk single AlN crystals in accordance with embodiments of the invention. Therefore, the terms "depositing," "growing," "depositing vapor species," and like terms are used herein to generally cover those techniques by which the crystal may be grown pursuant to embodiments of this invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. An AlN single-crystal substrate having a diameter of at least 2.5 cm and having a substrate versatility (SuV) metric, in $cm^2$, greater than 3, the SuV metric being defined by:

$$SuV = \frac{A}{[\log(BPD+0.1)+1.1] \times 10^t} \cong \frac{0.785 d^2}{[\log(BPD+0.1)+1.1] \times 10^t}$$

wherein A is the substrate area in $cm^2$, d is the substrate diameter in cm, t is the substrate thickness in cm, and BPD is the basal plane dislocation density, in $cm^{-2}$, in a center region of the substrate having an area greater than 1 $mm^2$.

2. The AlN single-crystal substrate of claim 1, wherein the SuV metric is greater than 60.

3. The AlN single-crystal substrate of claim 1, wherein the substrate diameter is at least approximately 5 cm.

4. The AlN single-crystal substrate of claim 1, wherein the substrate thickness is at least approximately 0.05 cm.

5. The AlN single-crystal substrate of claim 1, wherein the basal plane dislocation density in the center region of the substrate is approximately 0 $cm^{-2}$.

6. The AlN single-crystal substrate of claim 1, wherein the center region of the substrate has an area greater than 60 $cm^2$.

7. The AlN single-crystal substrate of claim 1, wherein the SuV metric is less than 185.

8. The AlN single-crystal substrate of claim 1, wherein the SuV metric is greater than 40.

9. The AlN single-crystal substrate of claim 1, wherein the substrate diameter is at least approximately 3.5 cm.

10. The AlN single-crystal substrate of claim 1, wherein a density of threading edge dislocations in the AlN single-crystal substrate is less than approximately $1 \times 10^4$ $cm^{-2}$.

11. The AlN single-crystal substrate of claim 1, wherein a density of threading screw dislocations in the AlN single-crystal substrate is less than approximately 10 $cm^{-2}$.

12. The AlN single-crystal substrate of claim 1, wherein the AlN single-crystal substrate exhibits an x-ray rocking curve having a full width at half maximum value less than 50 arcsec.

13. The AlN single-crystal substrate of claim 1, wherein a carbon concentration within the AlN single-crystal substrate is less than $5 \times 10^{16}$ $cm^{-3}$.

14. The AlN single-crystal substrate of claim 1, wherein a thermal conductivity of the AlN single-crystal substrate is greater than approximately 290 W/m·K, as measured in accordance with the American Society for Testing and Materials (ASTM) Standard E1461-13.

15. The AlN single-crystal substrate of claim 1, wherein the AlN single-crystal substrate has an Urbach energy ranging from approximately 0.2 eV to approximately 1.8 eV within an incident photon energy range of 5.85 eV to 6.0 eV, the Urbach energy $E_U$ being defined by:

$$\ln \alpha = \ln \alpha_0 + \left(\frac{hv}{E_U}\right)$$

wherein $\alpha$ is an absorption coefficient of the AlN single-crystal substrate at an incident photon energy hv, and $\alpha_0$ is a constant corresponding to the absorption coefficient at zero photon energy.

16. The AlN single-crystal substrate of claim 15, wherein the Urbach energy of the AlN single-crystal substrate ranges from approximately 0.21 eV to approximately 1.0 eV.

17. The AlN single-crystal substrate of claim 1, wherein the AlN single-crystal substrate has an ultraviolet (UV) absorption coefficient of less than 10 $cm^{-1}$ for an entire wavelength range of 220 nm to 280 nm.

18. The AlN single-crystal substrate of claim 1, wherein the center region of the substrate has an area greater than 1 $cm^2$.

19. The AlN single-crystal substrate of claim 1, wherein the center region of the substrate has an area greater than 10 $cm^2$.

20. The AlN single-crystal substrate of claim 1, wherein the center region of the substrate has an area greater than 70 cm².

\* \* \* \* \*